(12) United States Patent
Franca-Neto et al.

(10) Patent No.: US 10,361,365 B2
(45) Date of Patent: *Jul. 23, 2019

(54) IMPLEMENTING DEPOSITION GROWTH METHOD FOR MAGNETIC MEMORY

(71) Applicant: WESTERN DIGITAL TECHNOLOGIES, INC., San Jose, CA (US)

(72) Inventors: Luiz M. Franca-Neto, Sunnyvale, CA (US); Ricardo Ruiz, Santa Clara, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/876,632

(22) Filed: Jan. 22, 2018

(65) Prior Publication Data

US 2018/0145249 A1    May 24, 2018

Related U.S. Application Data

(62) Division of application No. 15/197,847, filed on Jun. 30, 2016, now Pat. No. 9,899,595, which is a division (Continued)

(51) Int. Cl.
| | |
|---|---|
| *H01L 21/00* | (2006.01) |
| *H01L 43/12* | (2006.01) |
| *H01L 27/22* | (2006.01) |
| *G11C 11/16* | (2006.01) |
| *H01L 43/08* | (2006.01) |

(Continued)

(52) U.S. Cl.
CPC ............ *H01L 43/12* (2013.01); *G11C 11/161* (2013.01); *G11C 11/1659* (2013.01); *G11C 11/1675* (2013.01); *G11C 11/18* (2013.01); *H01L 27/222* (2013.01); *H01L 27/228* (2013.01);

(Continued)

(58) Field of Classification Search
None
See application file for complete search history.

(56) References Cited

U.S. PATENT DOCUMENTS

| | | |
|---|---|---|
| 6,707,698 B2 | 3/2004 | Fricke et al. |
| 8,173,987 B2 | 5/2012 | Lung |

(Continued)

FOREIGN PATENT DOCUMENTS

| | | |
|---|---|---|
| WO | 2013/100939 A1 | 7/2013 |
| WO | 2013/101179 A1 | 7/2013 |

OTHER PUBLICATIONS

A Highly Stackable Thin-Film Transistor (TFT) NAND-Type Flash Memory; VLSI Technology; 2006 Symposium; Digest of Technical Papers; dated 2006.

(Continued)

*Primary Examiner* — Reema Patel
(74) *Attorney, Agent, or Firm* — Patterson & Sheridan, LLP; Steven Versteeg

(57) ABSTRACT

A magnetic memory array and a method for implementing the magnetic memory array for use in Solid-State Drives (SSDs) are provided. A plurality of magnetic pillar memory cells is formed using a deposition and/or growth process to produce a magnetic memory array substantially avoiding milling of magnetic materials.

15 Claims, 37 Drawing Sheets

Related U.S. Application Data of application No. 14/835,271, filed on Aug. 25, 2015, now Pat. No. 9,431,457.

(51) Int. Cl.
*H01L 43/02* (2006.01)
*H01L 43/10* (2006.01)
*G11C 11/18* (2006.01)

(52) U.S. Cl.
CPC .............. *H01L 43/02* (2013.01); *H01L 43/08* (2013.01); *H01L 43/10* (2013.01)

(56) References Cited

U.S. PATENT DOCUMENTS

| | | |
|---|---|---|
| 8,199,576 B2 | 6/2012 | Fasoli et al. |
| 8,547,720 B2 | 10/2013 | Samachisa et al. |
| 8,553,449 B2 | 10/2013 | Liu et al. |
| 8,563,961 B2 | 10/2013 | Sasago et al. |
| 8,565,003 B2 | 10/2013 | Siau |
| 8,625,322 B2 | 1/2014 | Samachisa et al. |
| 8,638,600 B2 | 1/2014 | Muralimanohar et al. |
| 9,899,595 B2 * | 2/2018 | Franca-Neto ......... H01L 27/228 |
| 2003/0123199 A1 | 7/2003 | Honda et al. |
| 2005/0259463 A1 | 11/2005 | Lim |
| 2012/0281465 A1 | 11/2012 | Agan et al. |
| 2013/0336038 A1 | 12/2013 | Cemea et al. |
| 2014/0052895 A1 | 2/2014 | Dai et al. |
| 2014/0101370 A1 | 4/2014 | Chu et al. |
| 2014/0319634 A1 | 10/2014 | Shukh |

OTHER PUBLICATIONS

A Novel Tri-Control Gate Surrounding Gate Transistor (TCG-SGT) Nonvolatile Memory Cell for Flash Memory; Solid-State Electronics; vol. 50, Issue 6, dated Jun. 2006; pp. 924-928.

Fujitsu Develops Technology Enabling Higher-Density Spin-Torque-Transfer MRAM; Fujitsu Laboratories, Ltd.; Kawasaki, Japan; dated Jun. 17, 2010.

Vertical Silicon Nano-Pillar for Non-Volatile Memory; Solid-State Sensors; Actuators and Microsystems Conference (Transducers); 2011 16th International; dated Jun. 5, 2011.

Challenges and Trends in Low-Power 3D Die-Stacked IC Designs Using RAM, Memristor Logic, and Resistive Memory (ReRAM); ASIC (ASICON); 2011 IEEE 9th International Conference; dated Oct. 25, 2011.

Resistive RAM: The Future Embedded Non-Volatile Memory?; Kilopass Technology; dated Mar. 22, 2012.

Liu, et al.; Spin-Torque Switching With the Giant Spin Hall Effect of Tantalum; Science Magazine; vol. 336, No. 6081; dated May 2012; pp. 555-558.

McGrath; Everspin Samples 64-Mb Spin-Torque MRAM; EE Times; dated Nov. 12, 2012.

Write Scheme Allowing Reduced LRS Nonlinearity Requirement in a 3D-RRAM Array With Selector-Less 1TNR Architecture; Electron Device Letters; IEEE; vol. 35, Issue 2; dated Jan. 2, 2014.

Vertical Stack Array of One-Time Programmable Nonvolatile Memory Based on pn-Junction Diode and Its Operation Scheme for Faster Access; IEIEC; pp. 1-11; dated Jan. 31, 2014.

Korczynski; 3D Memory for Future Nanoelectronic Systems; Micron | Semiconductor Manufacturing & Design Community; dated Jun. 18, 2014; pp. 1-17.

* cited by examiner

IMPLEMENTING DEPOSITION GROWTH METHOD FOR MAGNETIC MEMORY

CROSS-REFERENCE TO RELATED APPLICATIONS

This application is a divisional of co-pending U.S. patent application Ser. No. 15/197,847, filed Jun. 30, 2016, which application is a divisional of co-pending U.S. patent application Ser. No. 14/835,271, filed Aug. 25, 2015. Each of the aforementioned related patent applications is herein incorporated by reference.

BACKGROUND

Field

The present invention relates generally to the data storage field, and more particularly, relates to a magnetic memory array and a method for implementing the magnetic memory array for use in Solid-State Drives (SSDs).

Description of the Related Art

Typically NAND flash memory is the solid-state non-volatile memory used in Solid-State Drives (SSDs). Several alternative non-volatile memory technologies have been proposed. Phase-Change Memory (PCM) and Resistive RAM are two of those alternative technologies which received significant attention and are both considered emerging technologies.

A disadvantage of currently available solid-state non-volatile memory technologies is low endurance limits of program/erase cycles. Also in some known solid-state non-volatile memory technologies, there is a tradeoff between retention and power to program, and there is a tradeoff between power to program and endurance through a reliability dependence.

A need exists for effective mechanism for implementing a magnetic memory array for use in Solid-State Drives (SSDs).

SUMMARY

Aspects of the preferred embodiments are to provide a magnetic memory array and a method for implementing the magnetic memory array for use in Solid-State Drives (SSDs). Other important aspects of the preferred embodiments are to provide such magnetic memory array and method substantially without negative effect and to overcome some of the disadvantages of prior art arrangements.

In brief, a magnetic memory array and a method for implementing the magnetic memory array for use in Solid-State Drives (SSDs) are provided. A plurality of magnetic pillar memory cells is formed using deposition and/or growth process to produce a magnetic memory array substantially avoiding milling of magnetic materials.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION

Figure 1A:
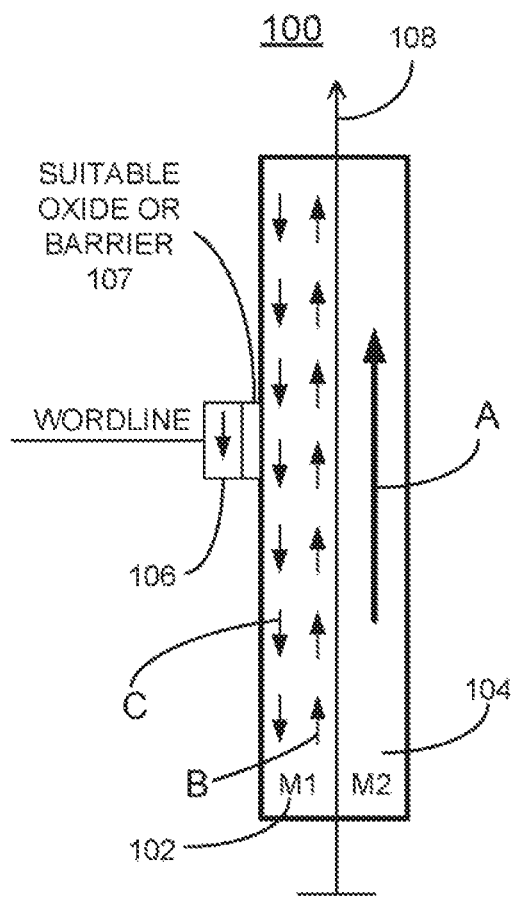
FIGS. 1A and 1B respectively illustrate a vertical channel construction and a horizontal channel construction of electrically equivalent magnetic memory cells in accordance with preferred embodiments.

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the preferred embodiments, a magnetic memory array and a method for implementing the magnetic memory array, for example, for use in Solid-State Drives (SSDs) are provided. A plurality of magnetic pillar memory cells is formed using a deposition and/or growth process to produce a magnetic memory array substantially avoiding milling of magnetic materials. A magnetic memory cell, for example, for Storage Class Memory (SCM) applications, includes programmable area with unpatterned programmable magnetic media. The magnetic memory cell is programmed in at least one of its magnetization states by a spin-biased steered current or spin-biased tunneling current. The magnetization state of the magnetic memory cell is sensed in a readout operation, for example, with steered currents in a low contrast readout operation or, for example, with tunneling currents in a high contrast readout operation. The magnetic memory cell is capable of high endurance, low power and adequate retention in various applications.

Drawings are shown in simplified form sufficient for understanding the preferred embodiments. Those skilled in the art will notice that references to a spacer layer between magnetic layers is frequently omitted in the drawings and textual description. The need for such a layer is assumed to be understood by those skilled in the art and it is only in the interest of simplifying the drawings only that the spacer is omitted in the figures described below.

Figure 1B:
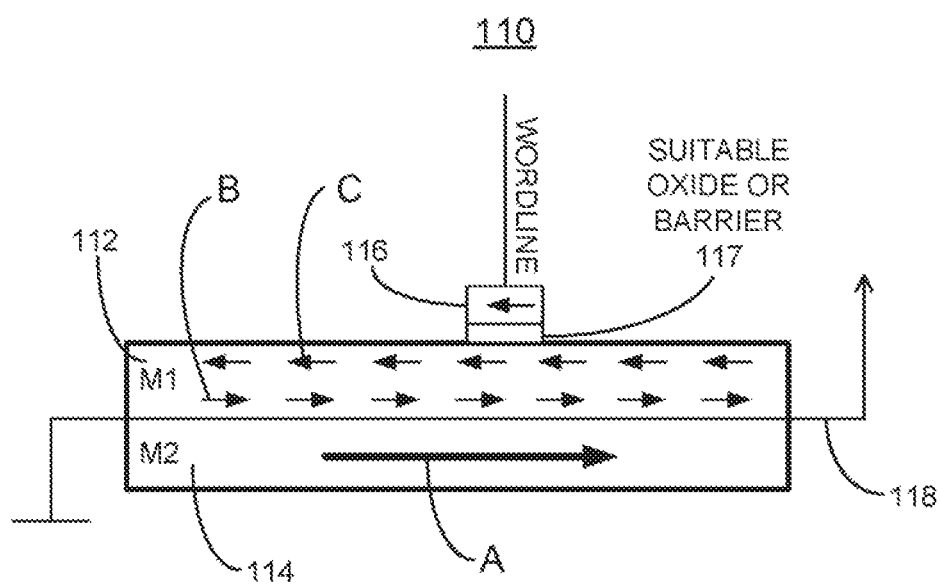

Having reference now to the drawings, FIGS. 1A and 1B respectively illustrate a vertical channel construction and a horizontal channel construction of electrically equivalent magnetic memory cells in accordance with preferred embodiments. In FIGS. 1A and 1B, there are shown example respective magnetic memory cell designs generally designated by the reference character 100, 110 having a vertical channel construction, and having a horizontal channel construction.

In FIG. 1A, the magnetic memory cell 100 includes programmable area using programmable magnetic media including a first conductor 102, M1, and a second conductor 104, M2. Optionally the conductors 102, M1, 104, M2 are formed of magnetic materials, and the conductor 104, M2 is more conductive than conductor 102, M1. Conductor 104, M2 is designed to have a permanent magnetization direction, such as indicated by an arrow A, whereas conductor 102, M1 is programmable in either parallel or anti-parallel magnetization states, such as indicated by respective arrows B and C. A wordline 106 is provided with a suitable oxide or tunneling barrier 107 for electric current flow between the magnetic wordline 106 and the channel conductor 102, M1. A line 108 extends between the conductors 102, M1, 104, M2 toward a bitline.

In FIG. 1B, the magnetic memory cell 110 includes programmable area using programmable magnetic media including a first conductor 112, M1, and a second conductor 114, M2. The conductors 112, M1, 114, M2 optionally are formed of magnetic materials, and the conductor 114, M2 is more conductive than conductor 112, M1. Conductor 114, M2 is designed to have a permanent magnetization direction, such as indicated by an arrow A, whereas conductor 112, M1 is programmable in either parallel or anti-parallel magnetization states, such as indicated by respective arrows B and C. A wordline 116 is provided with a suitable oxide or tunneling barrier 117 for electric current between the magnetic wordline 116 and the channel conductor 112, M1. A line 118 extends between the conductors 102, M1, 104, M2 toward a bitline.

In accordance with features of the preferred embodiments, conductor 104, M2, and conductor 114, M2 is optionally formed of a non-magnetic material, preferably Tantalum (Ta) with spin orbital coupling effects. Conductor 104, M2, and conductor 114, M2 being formed of a magnetic material provides better filtering of spin directions in operation of the magnetic memory cells 100, 110. For example, tantalum (Ta) is used, to form conductor 104, M2, and conductor 114, M2 instead of a magnetic material. The use of tantalum is an effective choice if the Spin Hall Effect (SHE) is strong enough in an implementation. If the SHE in tantalum is a strong enough effect, instead of filtering spins, tantalum can provide a spin current that will also torque the programmable M1 area. The magnetic conductor M2 can be used to filter electrons with spin that could torque the magnetization in the programmable conductor M1.

In accordance with features of the preferred embodiments, vertical and horizontal constructions of the magnetic memory cell 100, 110 are electrically equivalent, while enabling different advantages in fabrication processes. The horizontal construction of magnetic memory cell 110 potentially is easier to realize in a one-cell demonstration of concept, while the vertical construction of magnetic memory cell 100 may prove more suitable for an advantageous three dimensional (3D) array structure of those magnetic memory cells.

In accordance with features of preferred embodiments, the magnetic materials in conductor 102, M1, 104, M2 advantageously are not patterned. The association of conductors 102, M1, 104, M2 are referred to as totem. Note that in the vertical direction as shown in FIGS. 1A and 1B this totem optionally is constructed by deposition of materials in etched hole or silo, hence the name silo memory.

In accordance with features of preferred embodiments, because the vertical and horizontal constructions of the magnetic memory cells 100, 110 are electrically equivalent, programming and reading operations are described using the vertical construction of the magnetic memory cell 100.

In accordance with features of the preferred embodiments, memory cell 100 includes an unpatterned suitable oxide/barrier and non-queried cell transparency. Electrically controlled stress/strain is used by means of the unpatterned oxide/barrier suitable to affect ease of programmability and low power. Memory cell 100 includes an unpatterned programmable cell area. Steering of current for programming a memory cell and steering of spin-polarized current for reading a memory cell are provided. Combination of programming with a spin polarized steered current or a spin polarized tunneling current optionally is provided.

Figure 2A:
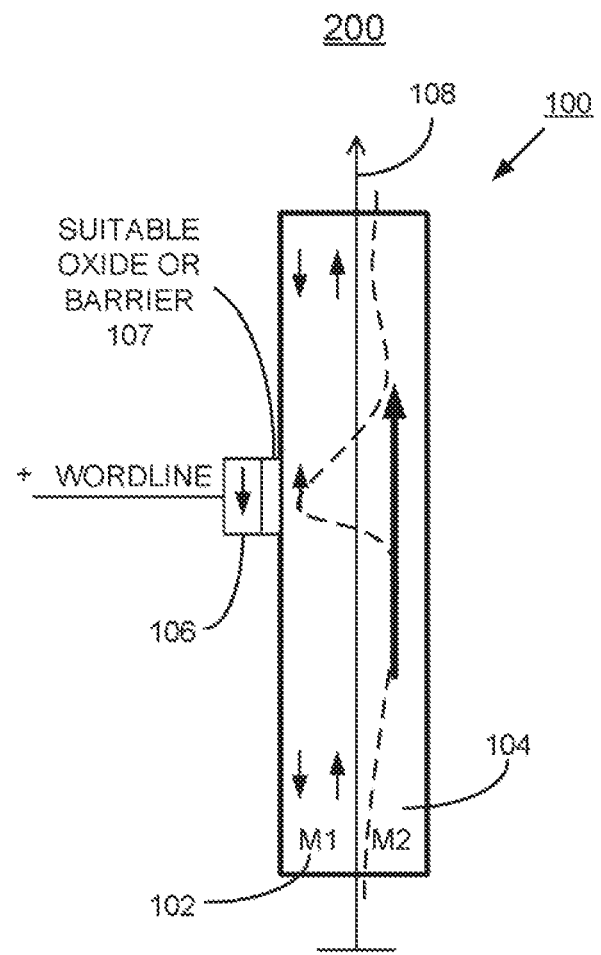
FIGS. 2A and 2B respectively illustrate programming magnetization up and magnetization down of the vertical channel magnetic memory cell of FIG. 1A in accordance with preferred embodiments.
Figure 2B:
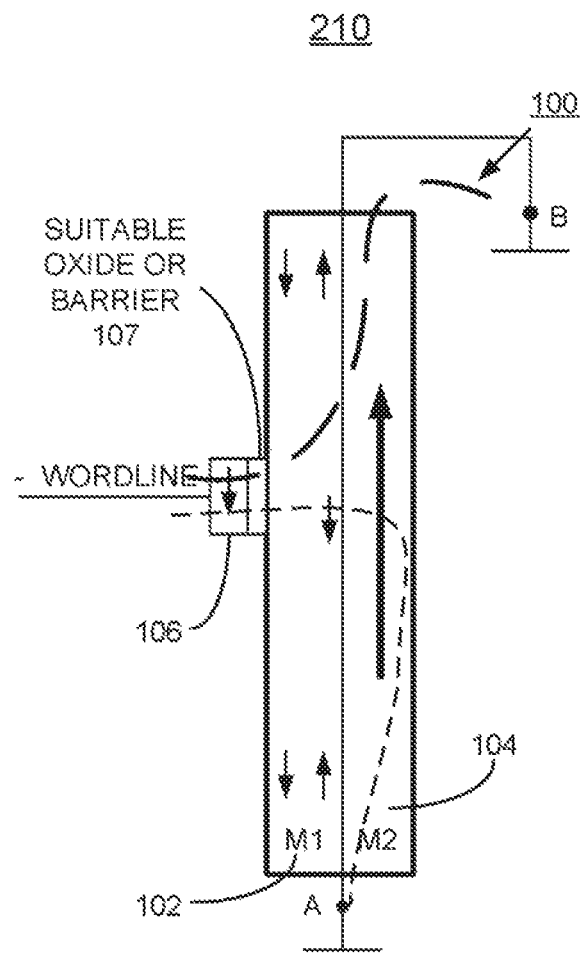

Referring to FIGS. 2A and 2B, there are shown respective example programming magnetization up generally designated by the reference character 200 and magnetization down generally designated by the reference character 210 of the vertical channel magnetic memory cell 100 of FIG. 1A in accordance with preferred embodiments. It should be understood that FIGS. 2A and 2B provide example operations, and one skilled in the art will recognize other variations can be found without departing from the spirit of the preferred embodiments. Current in the vertical totem prefers to stay in the more conductive conductor 104, M2.

In FIG. 2A, programming the state of magnetization up in the design 100 is performed by steering the spin-biased current in the totem into the programmable conductor 102, M1 in the area immediately adjacent to the wordline gate 106, 107. The line 108 extends between the conductors 102, M1, 104, M2 toward a bitline. In FIG. 2B, programming the state of magnetization down in the design 100 is performed by steering the spin-biased tunneling current flowing from the totem to the wordline gate 106 through the suitable oxide or barrier 107.

Figure 3A:
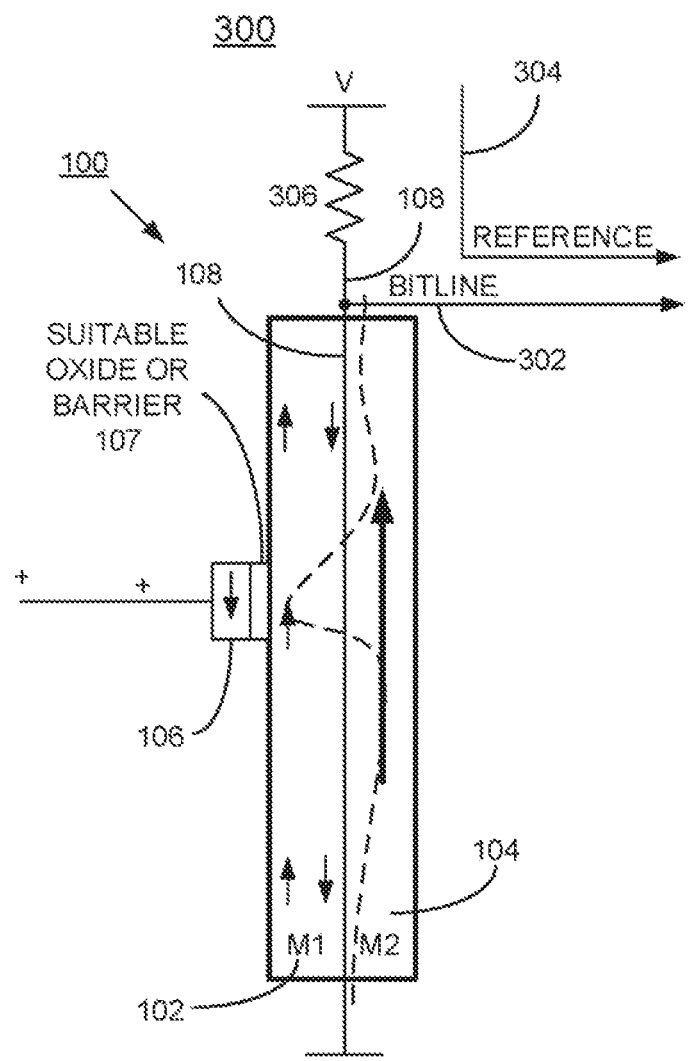
FIGS. 3A and 3B respectively illustrate programming magnetization up low resistance state readout operation and magnetization down high resistance state readout operation of the vertical channel magnetic memory cell of FIG. 1A in accordance with preferred embodiments.
Figure 3B:
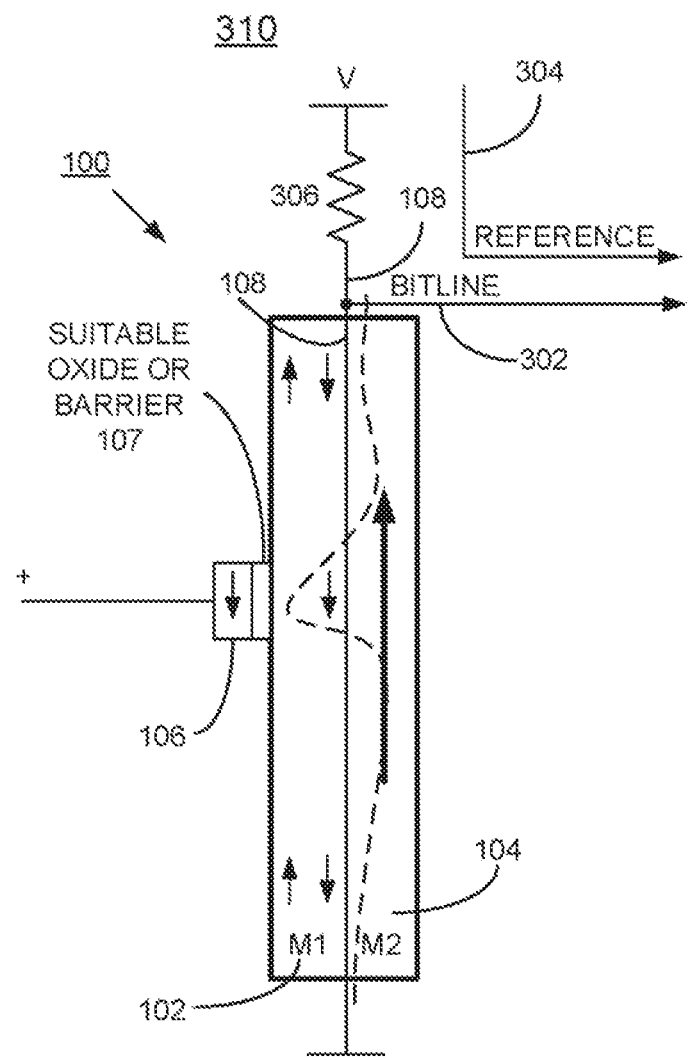

In accordance with features of the preferred embodiments, reading can be accomplished by two different methods. Method 1, shown in FIGS. 3A and 3B is referred to as low contrast read out operations. Method 2, shown in FIGS. 4A and 4B, is referred to as high contrast read out operations.

Referring to FIGS. 3A and 3B, there are shown example magnetization up low resistance state reading operation generally designated by the reference character 300 and magnetization down high resistance state reading operation generally designated by the reference character 310 of the vertical channel magnetic memory cell 100 of FIG. 1A in accordance with preferred embodiments. In FIGS. 3A and 3B, the line 108 extending between the conductors 102, M1, 104, M2 is connected to a bitline 302 and a reference 304 is shown. A resistor 306 connects line 108 and bitline 302 to a voltage supply V.

In accordance with features of preferred embodiments, in the low contrast readout operations 300, 310 of FIGS. 3A and 3B, the state of magnetization of memory cell 100 is sensed by steering current flowing in the vertical totem towards the programmed magnetic area. Note that a robust self-referenced algorithm for readout can include a multiple step self-referenced operation where the cell is first sensed, then written to a known content, and then sensed again. The difference between those sensed state readouts then used to determine the original cell content. In such a multiple step readout operation the original content may be destroyed and the cell might need to be rewritten after the being read.

Figure 4A:
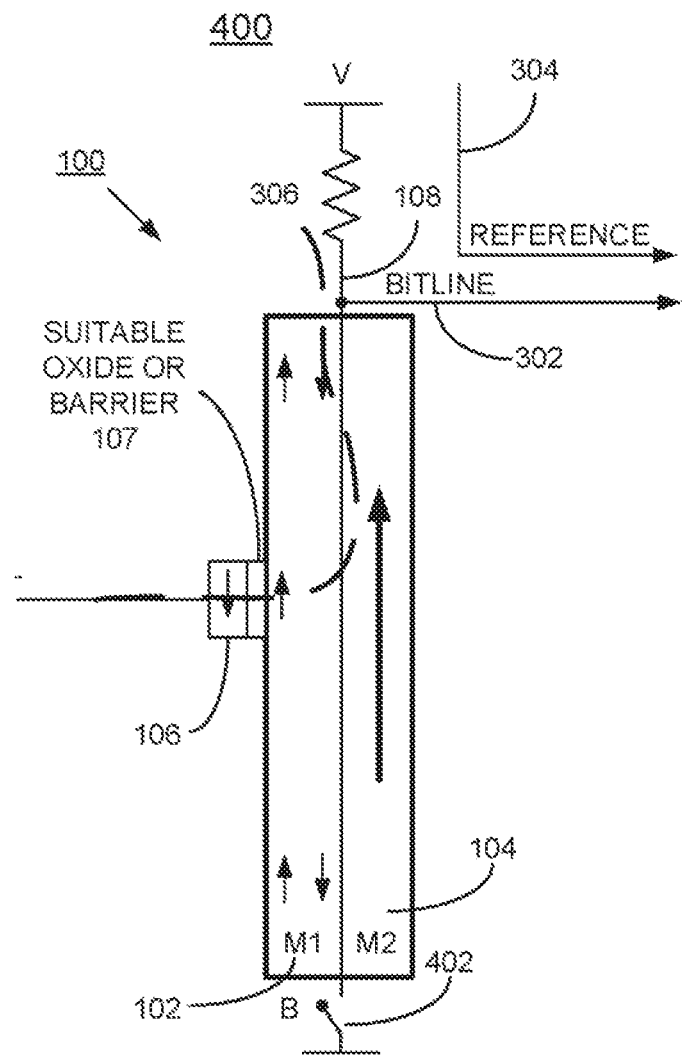
FIGS. 4A and 4B respectively illustrate programming magnetization up high resistance state high contrast readout operation and magnetization down low resistance state readout operation of the vertical channel magnetic memory cell of FIG. 1A in accordance with preferred embodiments.
Figure 4B:
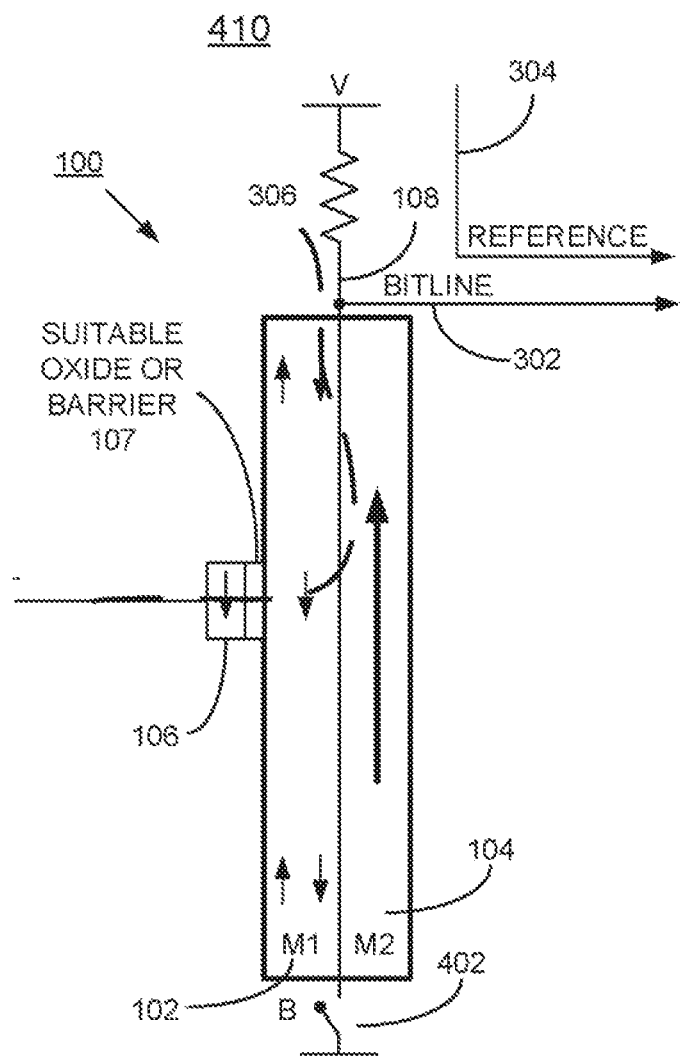

Referring to FIGS. 4A and 4B, there are shown example magnetization up high resistance reading operation generally designated by the reference character 400 and magnetization down low resistance state reading operation generally designated by the reference character 410 of the vertical channel magnetic memory cell 100 of FIG. 1A in accordance with preferred embodiments. FIGS. 4A and 4B shows the high contrast readout operation including a switch 402 between a ground potential connection and line 108 and bitline 302.

In accordance with features of preferred embodiments, in the high contrast readout operations 400, 410 of FIGS. 4A and 4B, the content of the magnetic cell 100 is sensed by spin-biased current flowing through the suitable oxide or barrier 107. Similar to the case of low contrast readout, a robust multiple step for readout, which is self-referenced, can be conceived with a readout operation, followed by a program operation to a known magnetization state, and a second readout operation. The cell content thus determined by the difference between the two readout operation results.

In accordance with features of preferred embodiments, in both low and high readout operations the level of current used must be low enough not to soft program the memory cell sensed.

Figure 5A:
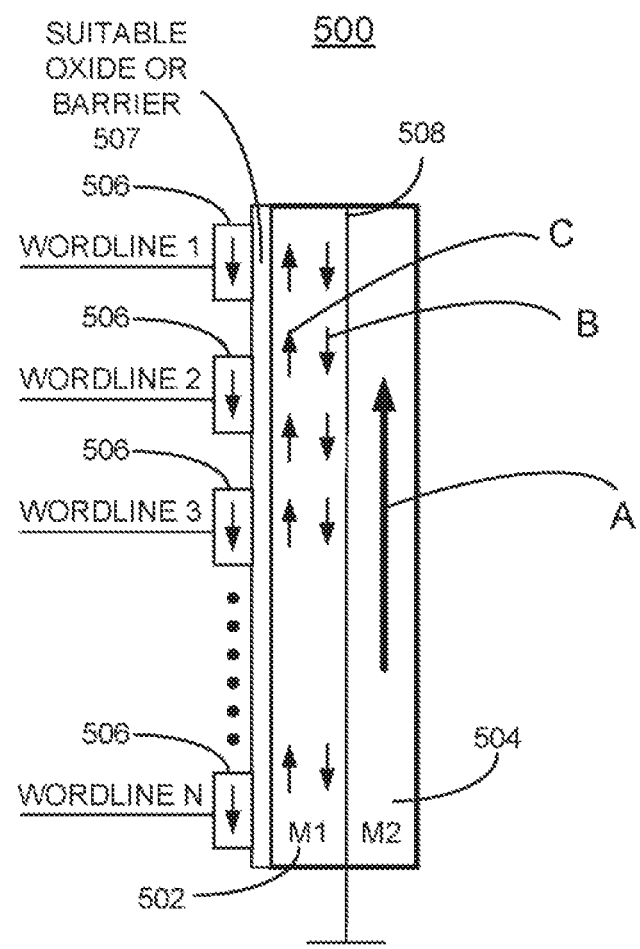
FIGS. 5A and 5B respectively illustrate a vertical channel construction and a horizontal channel construction of electrically equivalent magnetic memory cells with multiple wordlines in accordance with preferred embodiments.
Figure 5B:
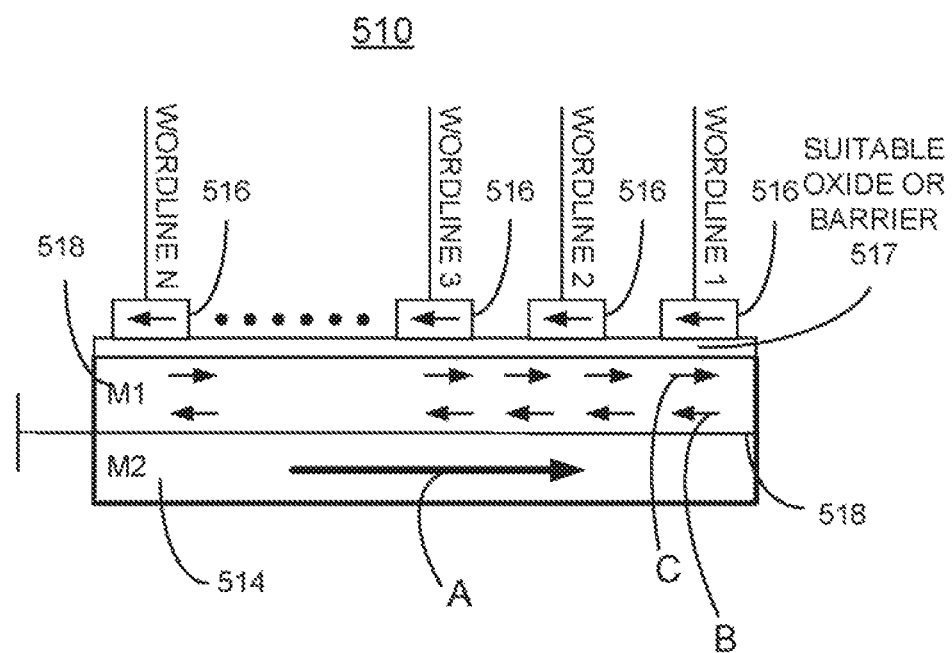

FIGS. 5A and 5B respectively illustrate a vertical channel construction generally designated by the reference character 500 and a horizontal channel construction generally designated by the reference character 512 of electrically equivalent one dimensional (1D) array magnetic memory cells with multiple wordlines in accordance with preferred embodiments.

In FIG. 5A, the magnetic memory cell array 500 includes programmable area using programmable magnetic media including a first conductor 502, M1, and a second conductor 504, M2. The conductors 502, M1, 504, M2 are formed of magnetic materials, and the conductor 504, M2 is more conductive than conductor 502, M1. Conductor 504, M2 is designed to have a permanent magnetization direction, such as indicated by an arrow A, whereas conductor 502, M1 is programmable in either parallel or anti-parallel magnetization states, such as indicated by respective arrows B and C. A plurality of wordlines 506 is provided with a suitable oxide or tunneling barrier 507 for electric current between the magnetic wordlines #1-N, 506 and the channel conductor 502, M1. A line 508 extends between the conductors 502, M1, 504, M2 toward a bitline.

In FIG. 5B, the magnetic memory cell array 510 includes programmable area using programmable magnetic media including a first conductor 512, M1, and a second conductor 514, M2. The conductors 512, M1, 514, M2 optionally are formed of magnetic materials, and the conductor 514, M2 is more conductive than conductor 512, M1. Conductor 514, M2 is designed to have a permanent magnetization direction, such as indicated by an arrow A, whereas conductor 512, M1 is programmable in either parallel or anti-parallel magnetization states, such as indicated by respective arrows B and C. A plurality of wordlines #1-N, 516 is provided with a suitable oxide or tunneling barrier 517 for electric current between the magnetic wordlines 516 and the channel conductor 512, M1. A line 518 extends between the conductors 512, M1, 514, M2 toward a bitline.

In accordance with features of preferred embodiments, the magnetic memory cell array 500 and magnetic memory cell array 510 are electrically equivalent but imply different advantages in fabrication processes. The horizontal construction may be easier to realize in a demonstration of concept, but the vertical construction may prove more suitable for an advantageous 3D array structure of those magnetic memory cells. Because the vertical and horizontal constructions are electrically equivalent, programming and reading operations are described respectively using the vertical construction in FIGS. 6A and 6B, and FIGS. 7A and 7B and FIGS. 8A and 8B.

Figure 6A:
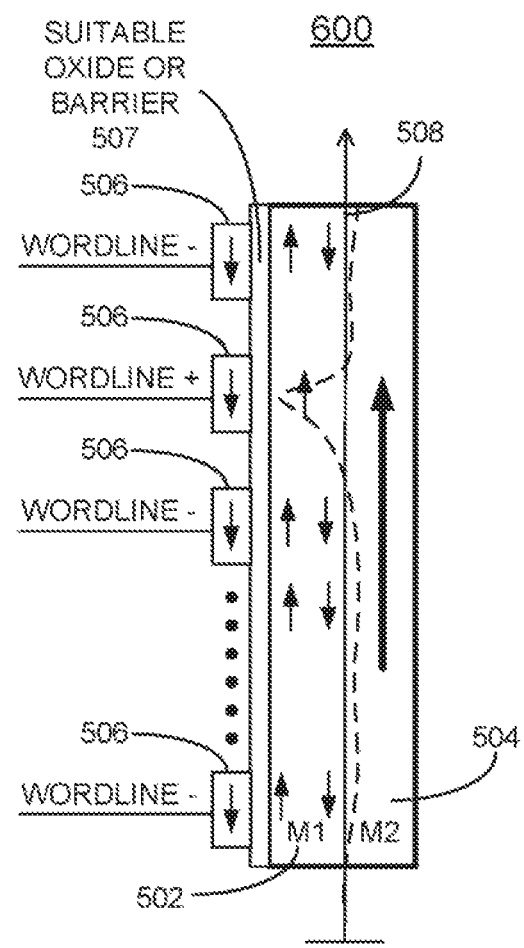
FIGS. 6A and 6B respectively illustrate programming magnetization up and magnetization down of the vertical channel magnetic memory cell of FIG. 5A in accordance with preferred embodiments.
Figure 6B:
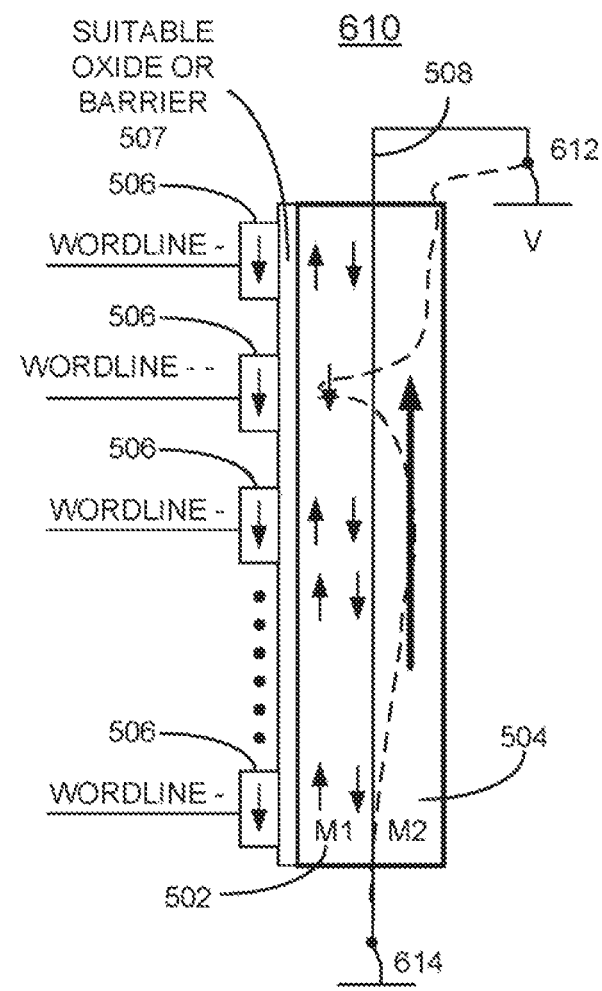

FIGS. 6A and 6B respectively illustrate programming magnetization up generally designated by the reference character 600 and magnetization down of the vertical channel magnetic memory cell array of FIG. 5A in accordance with preferred embodiments. FIGS. 6A and 6B illustrate an exemplifying design, while the skilled in the art will recognize other variations can be found without departing from the spirit of the preferred embodiments. Current in the vertical totem prefers to stay to in the more conductive conductor 504, M2. Programming the state of magnetization up in the design 600 of FIG. 6A is performed by steering the spin-biased current in the totem into the programmable conductor 502, M1 in the area immediately adjacent to the wordline gate 506. Programming the state of magnetization down in the design 612 of FIG. 6B can be accomplished by the spin-biased tunneling current flowing from the totem to the wordline gate 506 through the suited oxide or barrier 507 which includes a pair of switches 612, 614 respectively connected between line 508 and the voltage rail V and ground and where −− indicates a more negative voltage than −.

In accordance with features of preferred embodiments, note that current flow through the totem without affecting the non-queried memory cells. This feature of the array to allow a shared media for programming any of the cells in the array without disturbing the non-queried cells is referred to as a feature allowing for the non-queried cells to become transparent. Also, the unpatterned layer of the suitable oxide/barrier 507 allows for adding the feature of electrically controlling the stress/strain imposed on the area of conductor 502, M1 to be programmed with the effect of easing programming, or lowering the current levels needed for programming.

Figure 7A:
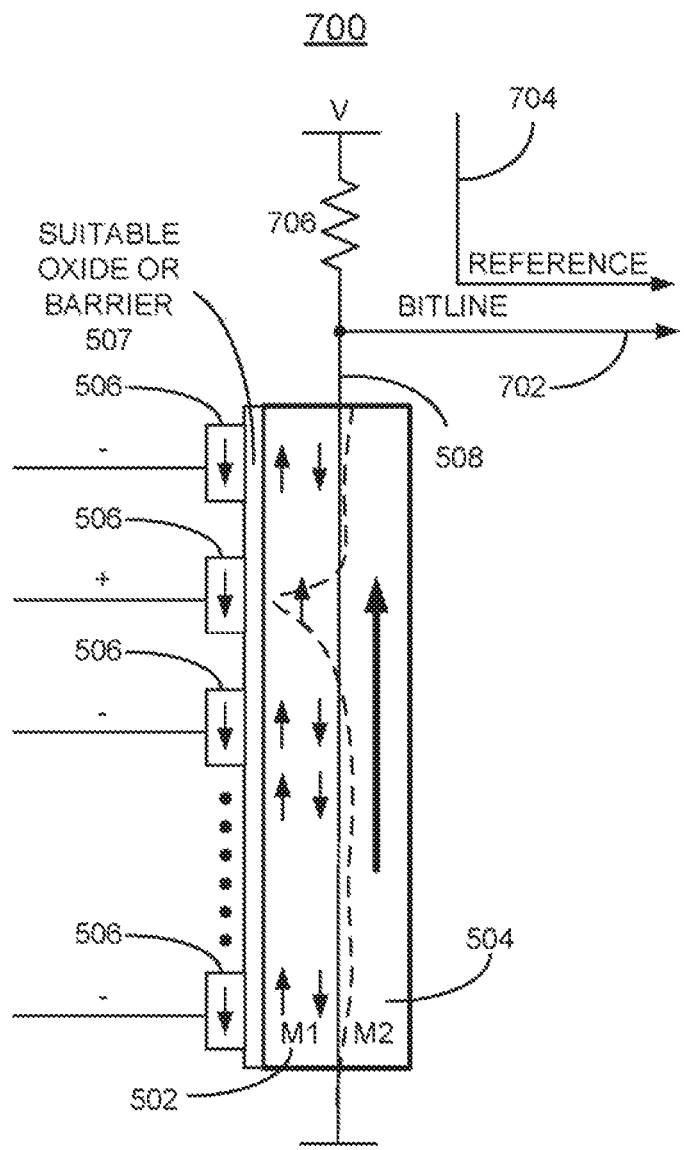
FIGS. 7A and 7B respectively illustrate programming magnetization up low resistance state and magnetization down high resistance state of the vertical channel magnetic memory cell of FIG. 5A in accordance with preferred embodiments.
Figure 7B:
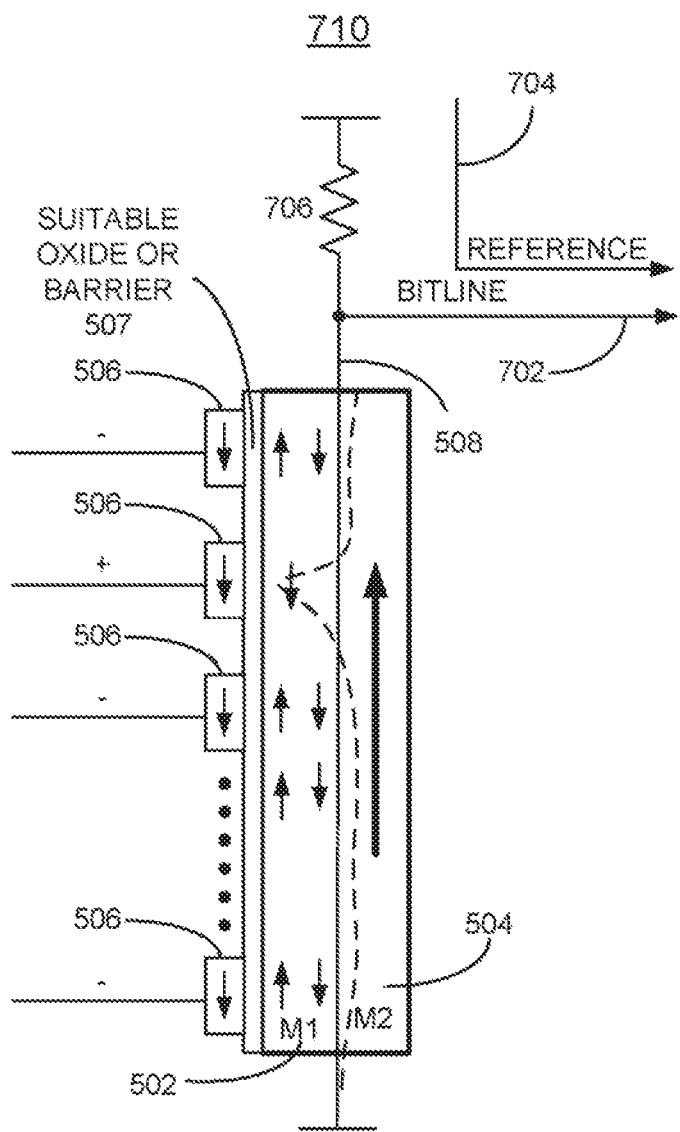

FIGS. 7A and 7B respectively illustrate programming magnetization up low resistance state low contrast readout operation generally designated by the reference character 700 and magnetization down high resistance state low contrast readout operation generally designated by the reference character 710 of the vertical channel magnetic memory cell 500 of FIG. 5A in accordance with preferred embodiments. FIGS. 7A and 7B illustrate a bitline 702 connected to line 508, a reference 704, and a resistor 706 connected between the bitline 702 and voltage rail V.

In accordance with features of preferred embodiments, in the low contrast readout operations of FIGS. 7A and 7B, the state of magnetization of memory cell is sensed by steering current flowing in the vertical totem towards the programmed magnetic area. Note that a robust self-referenced algorithm for readout can include a multiple step operation where the cell is first sensed, then written to a known content, and then sensed again. The difference between those sensed state readouts is used to determine the original cell content. In such a multiple step readout operation the original content may be destroyed and the cell might need to be rewritten after the being read.

Figure 8A:
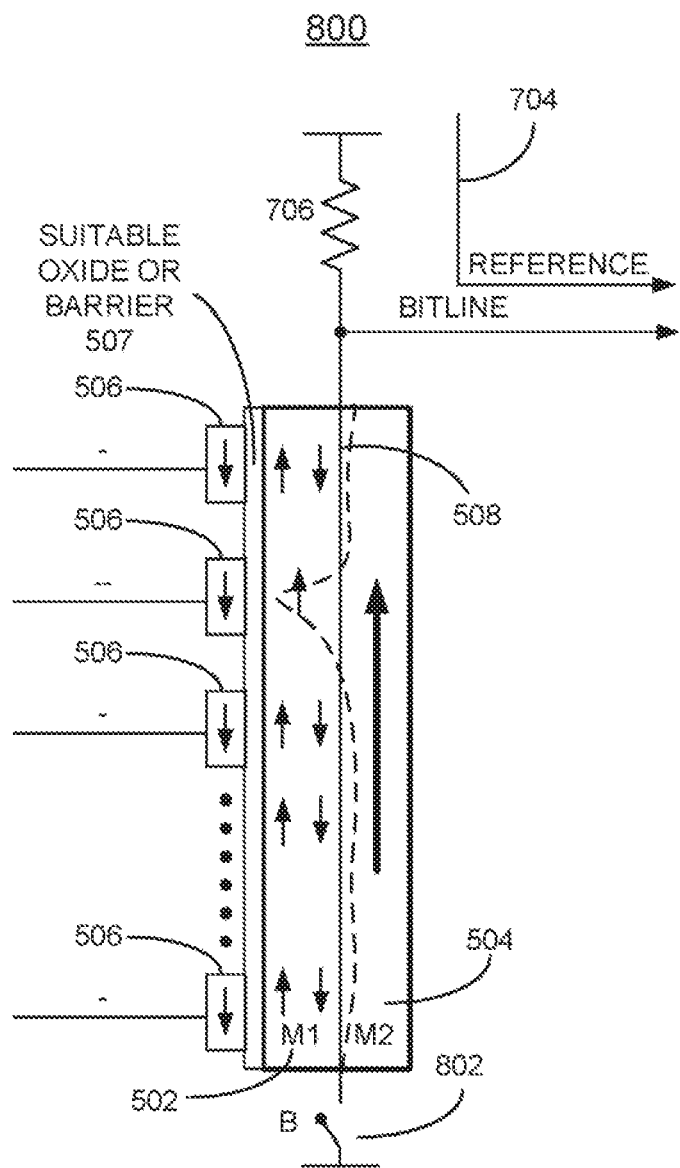
FIGS. 8A and 8B respectively illustrate programming magnetization up high resistance state and magnetization down low resistance state of the vertical channel magnetic memory cell of FIG. 5A in accordance with preferred embodiments.
Figure 8B:
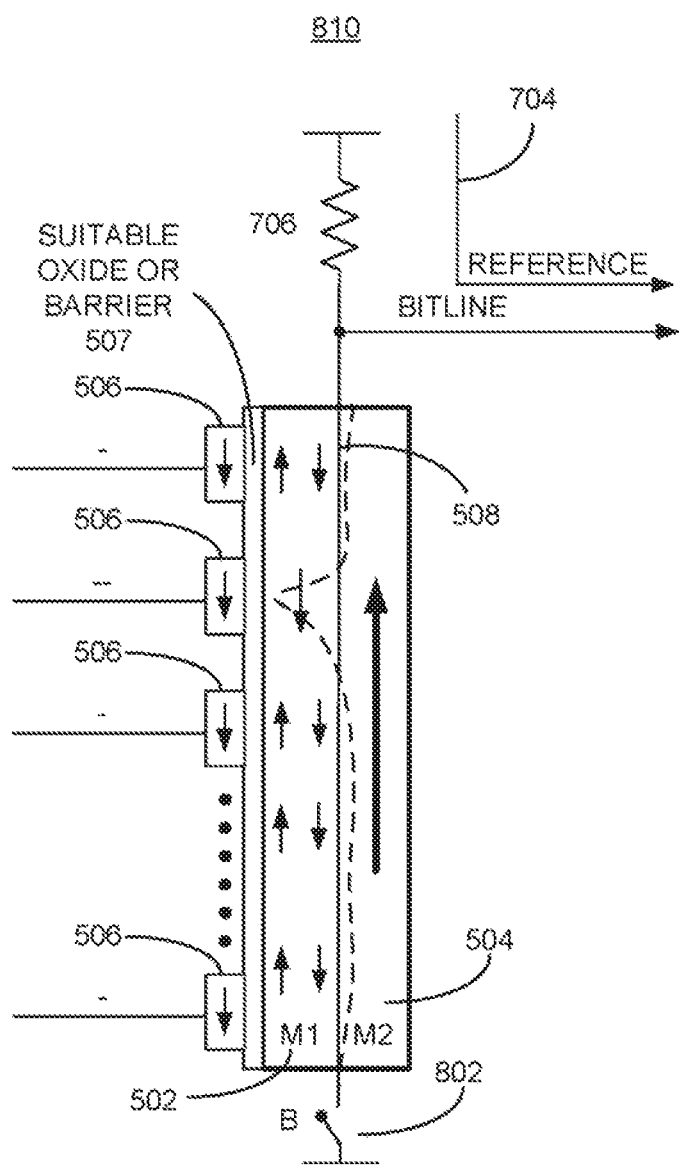

FIGS. 8A and 8B respectively illustrate programming magnetization up high resistance state high contrast readout operation generally designated by the reference character 800 and magnetization down low resistance state high contrast readout operation generally designated by the reference character 810 of the vertical channel magnetic memory cell 500 in accordance with preferred embodiments. FIGS. 8A and 8B illustrate a bitline 702 connected to line 508, a reference 704, and a resistor 706 connected between the bitline 702 and voltage rail V, and a switch 802 connected between line 508 and ground potential.

In accordance with features of preferred embodiments, in the high contrast readout operations of FIGS. 8A and 8B, the content of the magnetic cell is sensed by spin-biased current flowing through the suitable oxide or barrier 507. Similar to the case of low contrast readout operations of FIGS. 7A and 7B, a robust multiple step for readout, which is self-referenced, can be used with the readout operation, followed by a program operation to a known magnetization state, and a second readout operation. The cell content thus determined by the difference between the two readout operation results.

In accordance with features of preferred embodiments, in both low and high readout operations of FIGS. 7A and 7B, and FIGS. 8A and 8B, the level of current used must be low enough not to soft program the memory cell sensed.

Figure 9A:
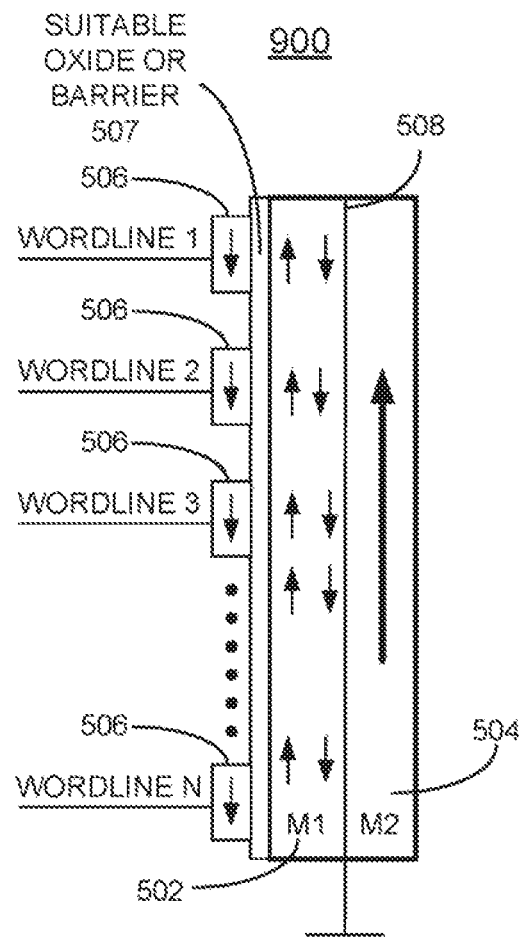
FIGS. 9A, 9B and 9C respectively illustrate use of revolution around the vertical axis to construct a vertical one dimensional (1) array embodiment of magnetic memory cells using of the vertical channel magnetic memory cell of FIG. 5A in accordance with preferred embodiments.
Figure 9B:
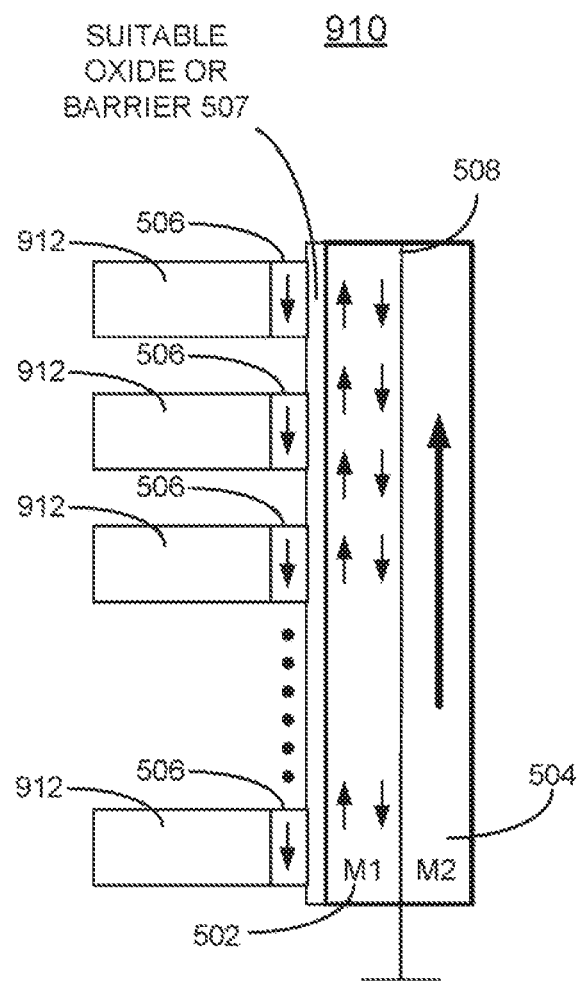
Figure 9C:
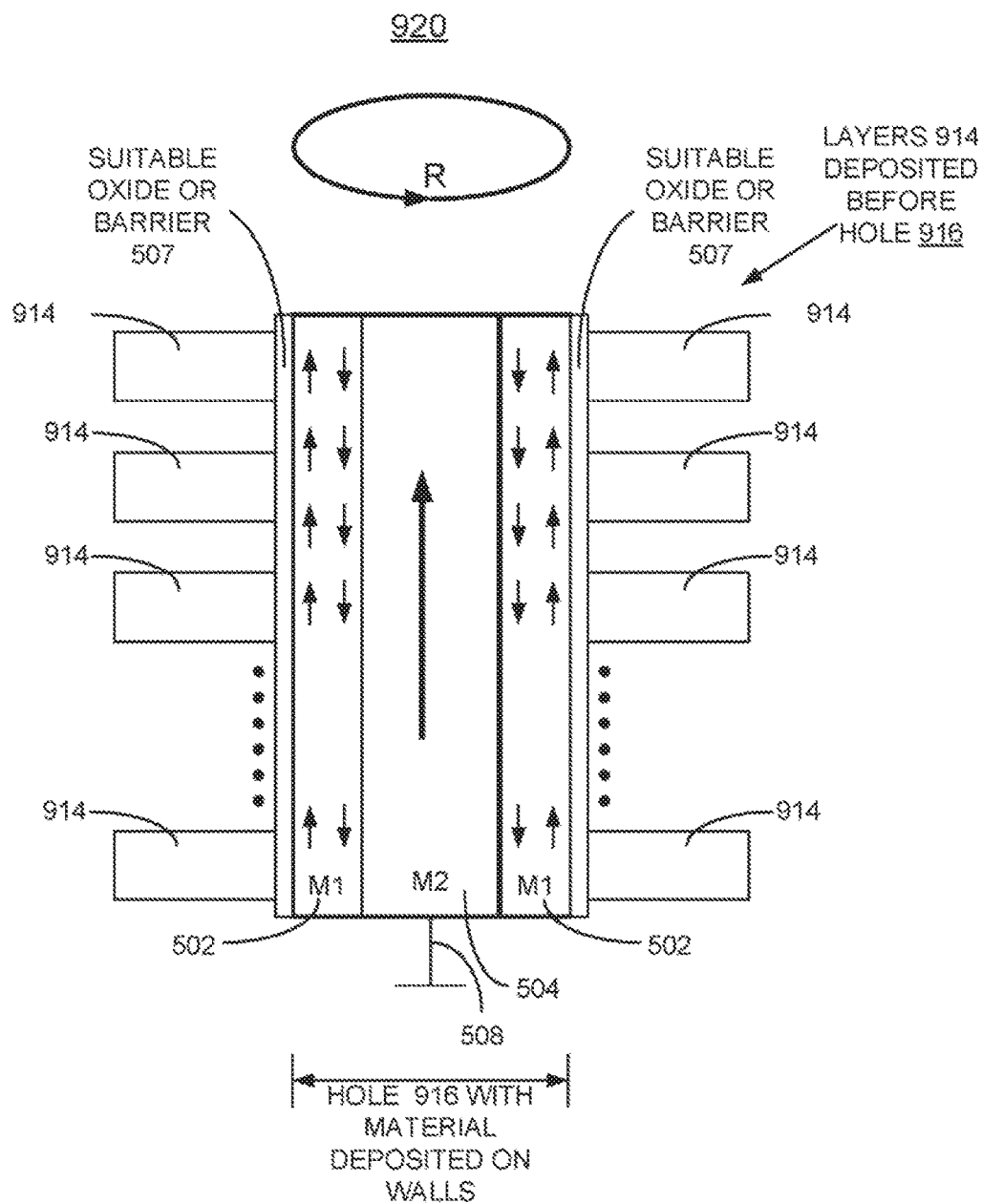

FIGS. 9A, 9B and 9C respectively illustrate use of revolution around the vertical axis to construct a vertical one dimensional (1D) array embodiment of magnetic memory cells using of the vertical channel magnetic memory cell 500 in accordance with preferred embodiments.

In accordance with features of preferred embodiments, in FIG. 9A a starting construct generally designated by the reference character 900 is shown of the magnetic memory cell array 500 with multiple wordlines 506. In FIG. 9B, a next construct generally designated by the reference character 910 is shown extending oxide 912. In FIG. 9C, a next construct generally designated by the reference character 920 includes extending magnetic leads 914 and make one revolution indicated by arrow R. Conductive materials 502, M1 are deposited on walls of a hole 916. The layers defining magnetic leads 914 are deposited before the hole 916.

Figure 10:
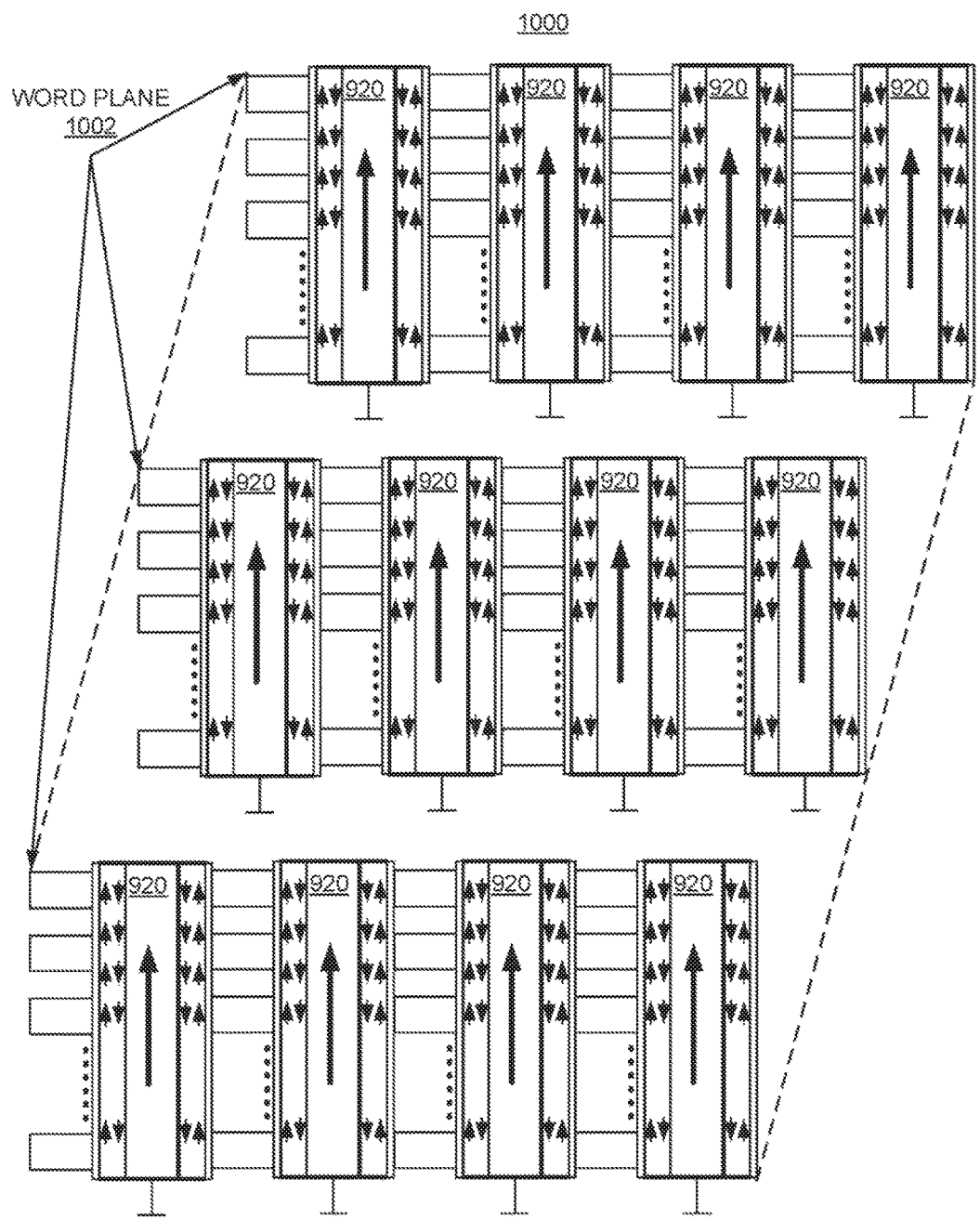
FIG. 10 illustrates a two dimensional (2D) plane extended to construct a vertical three dimensional (3D) array embodiment of magnetic memory cells using of the vertical channel magnetic memory cell of FIG. 5A in accordance with preferred embodiments.

FIG. 10 illustrates a vertical three dimensional (3D) array embodiment generally designated by the reference character 1000 from the construct 920 extended on a two dimensional (2D) plane or word plane 1002 in accordance with preferred embodiments. In FIG. 10, the magnetic leads or wordlines 914 are extended to the word plane 1002.

In accordance with features of preferred embodiments, a 3D array 1000 can be constructed with a single critical etching step for all the vertical totems followed by deposition of a suitable oxide/barrier and magnetic materials.

Figure 11A:
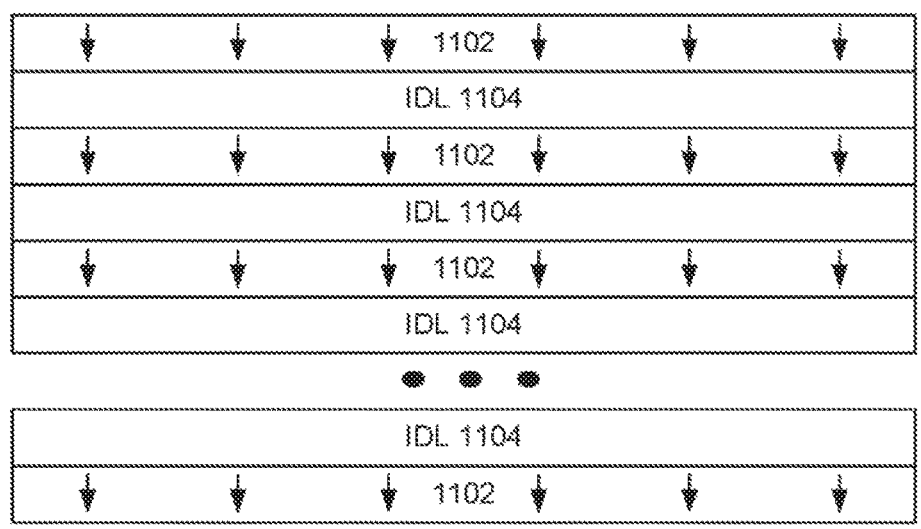
FIGS. 11A and 11B respectively illustrate a magnetic memory three dimensional (3D) array embodiment of magnetic memory cells using an interlayer dielectric (IDL) stack in accordance with preferred embodiments.
Figure 11B:
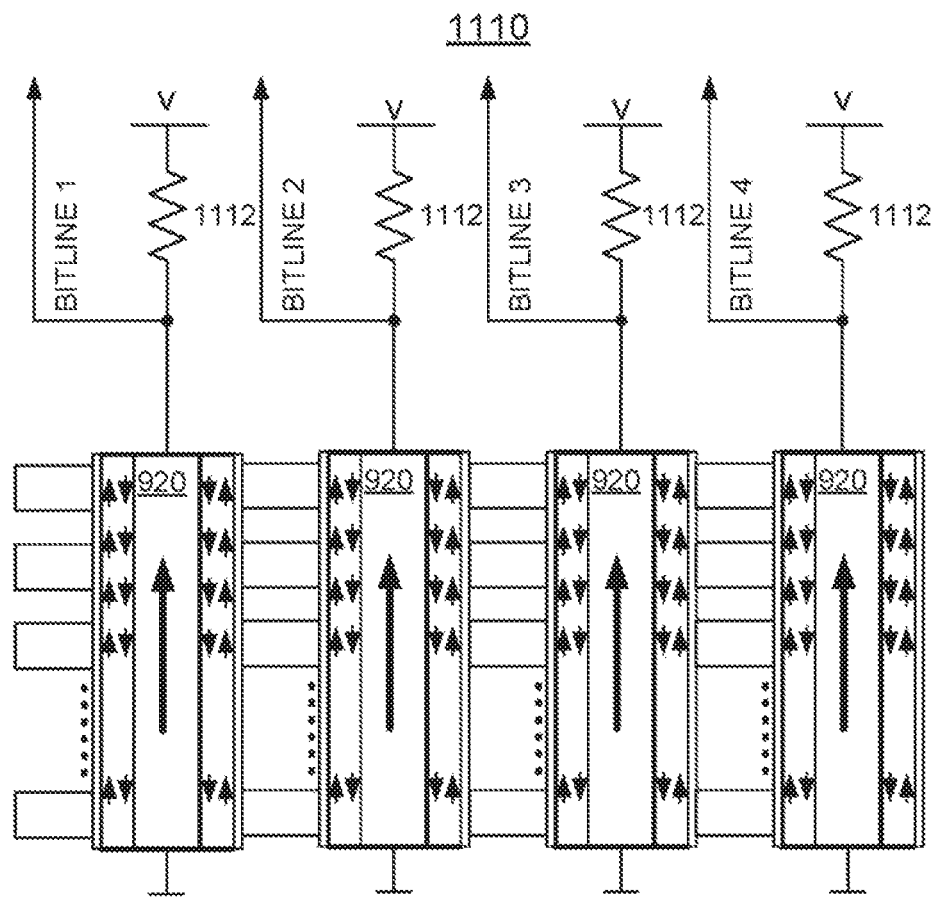

FIGS. 11A and 11B respectively illustrate a magnetic memory three dimensional (3D) array embodiment of magnetic memory cells using an interlayer dielectric (IDL) stack in accordance with preferred embodiments. In FIG. 11A, there is shown an interlayer dielectric (IDL) stack generally designated by the reference character 1100. In FIG. 11B, there is shown a magnetic memory three dimensional (3D) array generally designated by the reference character 1110 including a plurality of vertical one dimensional (1D) array 920 of FIG. 9C with multiple word planes 1-N (instead of wordlines) shared by all memory cells 500 in a plane level. A respective bitline #1-4 is shared only by memory cells in the same totem. A resistor 1112 is connected between each of the bitlines #1-4 as shown in FIG. 11B.

Figure 12A:
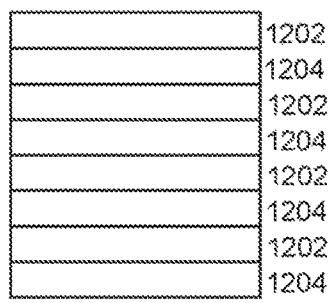
FIGS. 12A, 12B and 12C illustrate a three dimensional (3D) array embodiment of magnetic memory cells showing respective example steps to create one contact per wordplane in accordance with preferred embodiments.
Figure 12B:
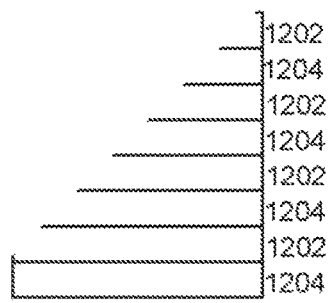
Figure 12C:
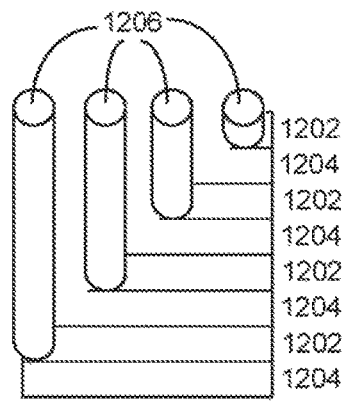

FIGS. 12A, 12B and 12C illustrate a three dimensional (3D) array embodiment of magnetic memory cells showing respective example steps to create one contact per wordplane in accordance with preferred embodiments. In FIG. 12A, a starting structure generally designated by the reference character 1200 in accordance with preferred embodiments. Starting structure 1200 includes a plurality of word planes 1202 separated by a respective interlayer dielectric (IDL) 1204. In FIG. 12B, a single etch step generally designated by the reference character 1210 is performed to expose respective spaced-apart word planes 1202. In FIG. 12B, a final structure generally designated by the reference character 1220 is provided by a first deposition step depositing a dielectric, etching respective holes, and coating the respective holes with an oxide layer and filling the holes with M1 and M2 magnetic memory cell materials with the M1 metal forming respective word plane contacts 1206.

FIGS. 13A, 13B and 13C and FIGS. 14A, 14B, 14C, 14D, and 14E illustrate respective example paths for integration of the three dimensional (3D) array embodiment of magnetic memory cells onto a complementary metal oxide semiconductor (CMOS) wafer in accordance with preferred embodiments.

Figure 13A:
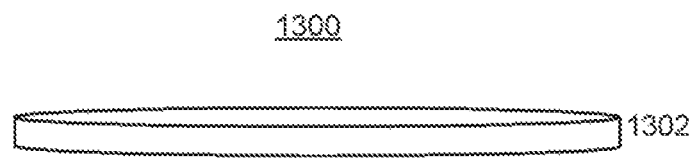
FIGS. 13A, 13B and 13C and FIGS. 14A, 14B, 14C, 14D, and 14E illustrate respective example paths for integration of the three dimensional (3D) array embodiment of magnetic memory cells onto a complementary metal oxide semiconductor (CMOS) wafer in accordance with preferred embodiments.
Figure 13B:
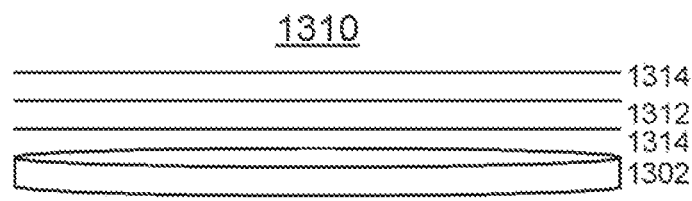
Figure 13C:
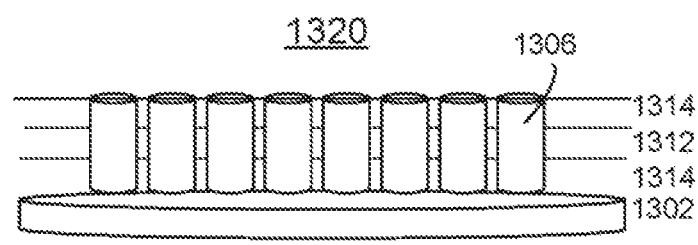

In FIGS. 13A, 13B and 13C, a first path includes layers of magnetic and interlayer dielectrics are deposited onto an already finished CMOS wafer with the necessary programming and reading circuitry. An initial structure generally designated by the reference character 1300 in FIG. 13A includes a CMOS wafer 1302. A next structure generally designated by the reference character 1310 in FIG. 13B includes a stack of layers of magnetic and interlayer dielectrics 1312, 1314. A preliminary etch exposes alignment marks already present in the CMOS wafer. These alignment marks (not shown) guide a critical etch that creates respective totems 1306 for depositing the magnetic materials which will form the 3D magnetic memory array generally designated by the reference character 1320 in FIG. 13C.

Figure 14A:
Figure 14B:
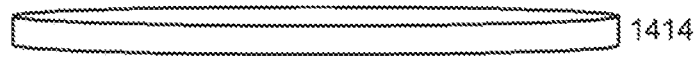
Figure 14C:
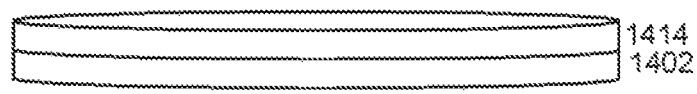
Figure 14D:
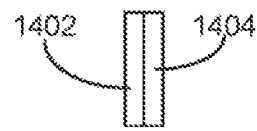

In FIGS. 14A, 14B, 14C, 14D, and 14E, illustrate a second path 2. In FIGS. 14A and 14B, separate initial structures are respectively generally designated by the reference character 1400, and 1410. In FIG. 14A, structure 1400 includes a CMOS wafer 1402 and in FIG. 14B, structure 1410 includes a wafer 1414 including a 3D array of memory cells that are fully finished in separate wafers. In FIG. 14C, a next structure generally designated by the reference character 1420 includes the wafer 1414 including a 3D array of memory cells bonded to the CMOS wafer 1402. For example, the wafers 1402, 1414 are treated with a finish that includes a capability to develop conductive filaments by electric field. After both wafer are bonded together in FIG. 14C, the structure 1420 is sawed in row of dices, one generally designated by the reference character 1430 in FIG. 14D.

Figure 14E:
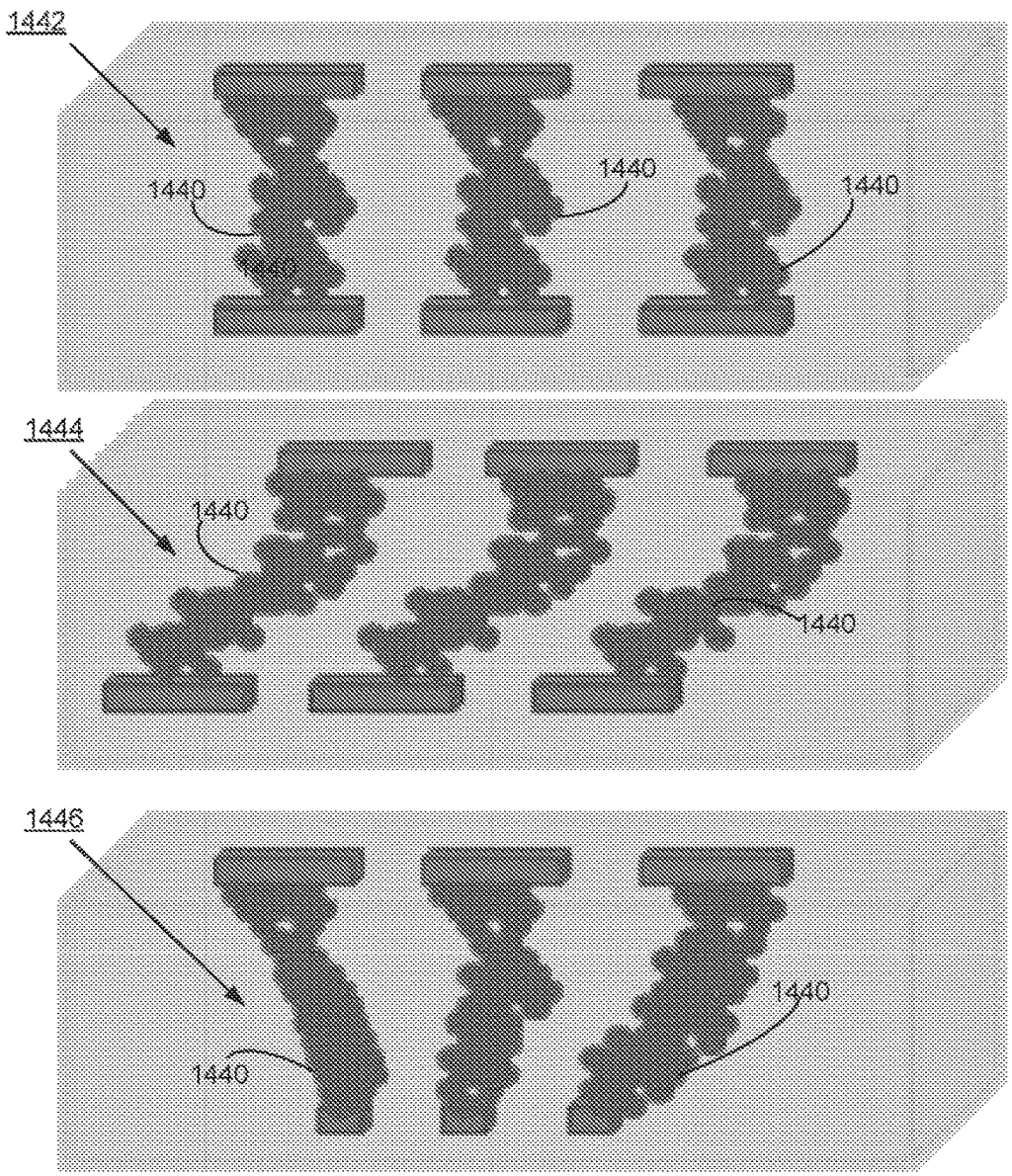

In accordance with features of preferred embodiments, the circuits in the CMOS and 3D memory array are then activated to form a plurality of conductive filaments 1440 that will make the necessary electrical connections for the full functionality of the final memory solution die/chip, for example, as shown in example structures respectively generally designated by the reference characters 1442, 1444, and 1446 in FIG. 14E, each including respective conductive filaments 1440. The conductive filaments 1440 provide robustness against minor misalignment between the wafers 1402, 1414 after bonding.

Figure 15A:
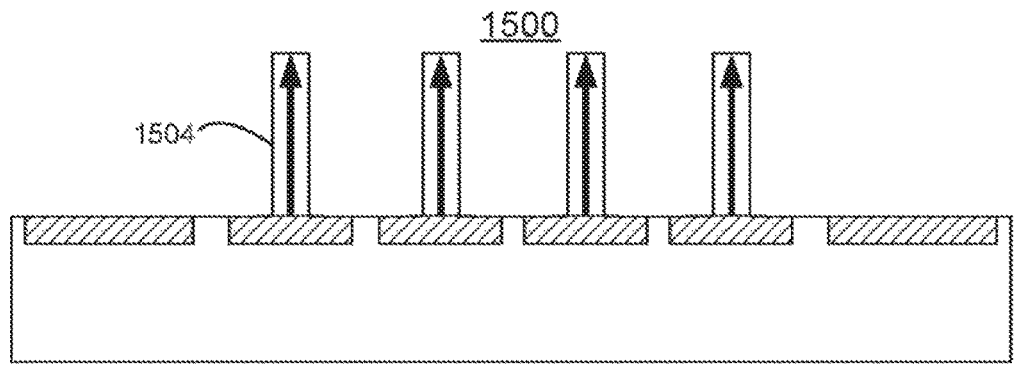
FIGS. 15A, 15B, 15C, 15D, and 15E illustrate example steps for growing magnetic memory cells on a complementary metal oxide semiconductor (CMOS) wafer in accordance with preferred embodiments.
Figure 15B:
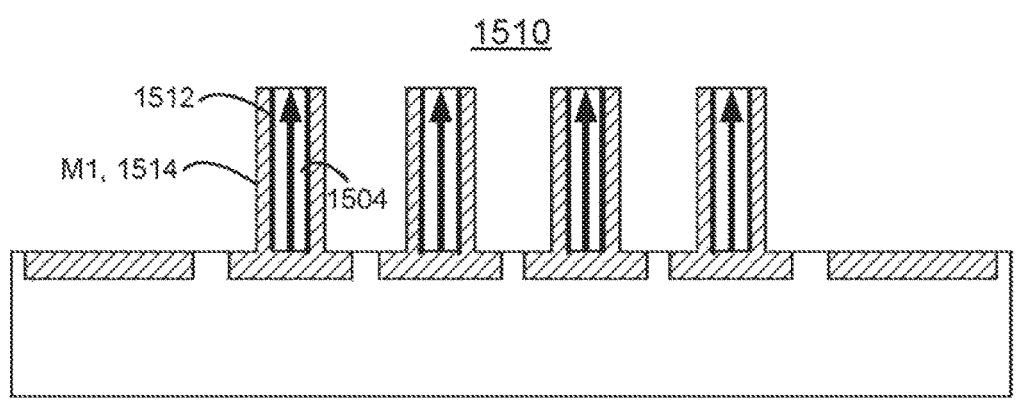
Figure 15C:
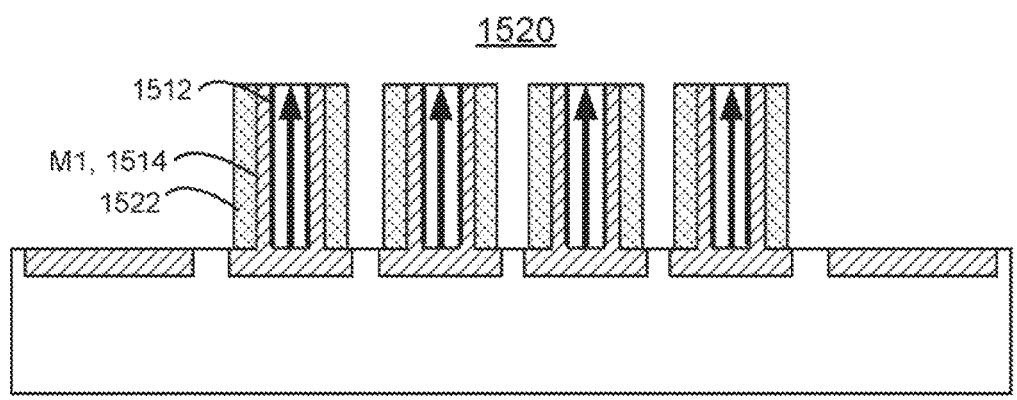
Figure 15D:
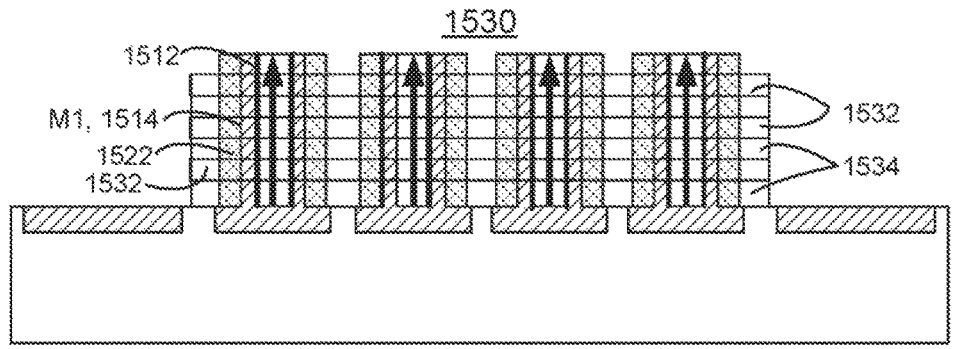
Figure 15E:
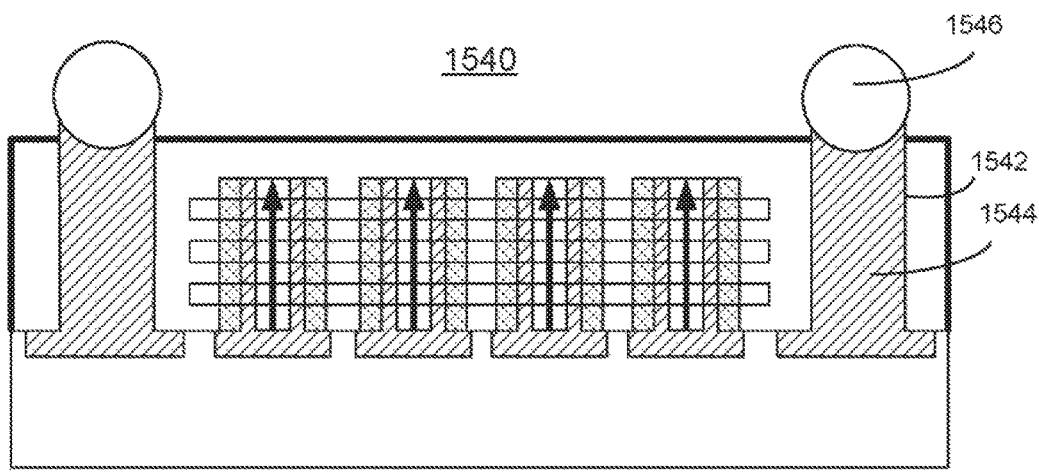

FIGS. 15A, 15B, 15C, 15D, and 15E illustrate example steps for growing magnetic memory cells on a complementary metal oxide semiconductor (CMOS) wafer in accordance with preferred embodiments. In FIG. 15A, a first step generally designated by the reference character 1500 includes a core (biased) including, for example, electroplated grown or columnar growth of the conductor M2, 1502. Step 1500 may need to exploit shadow effect and be planned to intercept future CMOS technology node. For example, F<20 nm possibly are viable dimensions. In FIG. 15B, a next step generally designated by the reference character 1510 includes the conductor M2, 1504 being coated with a non-magnetic spacer layer 1512, such as a Ruthenium layer, and a soft programmable layer or conductor M1, 1514 grown over the pillar including Ru 1512 and conductor M2 1504. A metallic granularity in the magnetic material forming the conductor M1, 1514 is provided to enable or allow better creation of domain walls so each cylindrical magnetic random access memory (MRAM) cell is independently programmable. In FIG. 15C, a next step generally designated by the reference character 1520 includes, for example, an oxide layer 1522, such as a MgO layer deposited, diminishing the risk of electrically shortening columns. In FIG. 15D, a next step generally designated by the reference character 1530 includes deposition of ILD layers 1532 and word plane layers 1534 with anti-parallel vertical bias. In FIG. 15E, a next step generally designated by the reference character 1540, for example, includes forming vias 1542, conductive connections 1544 and package balls 1546 added.

Figure 16A:
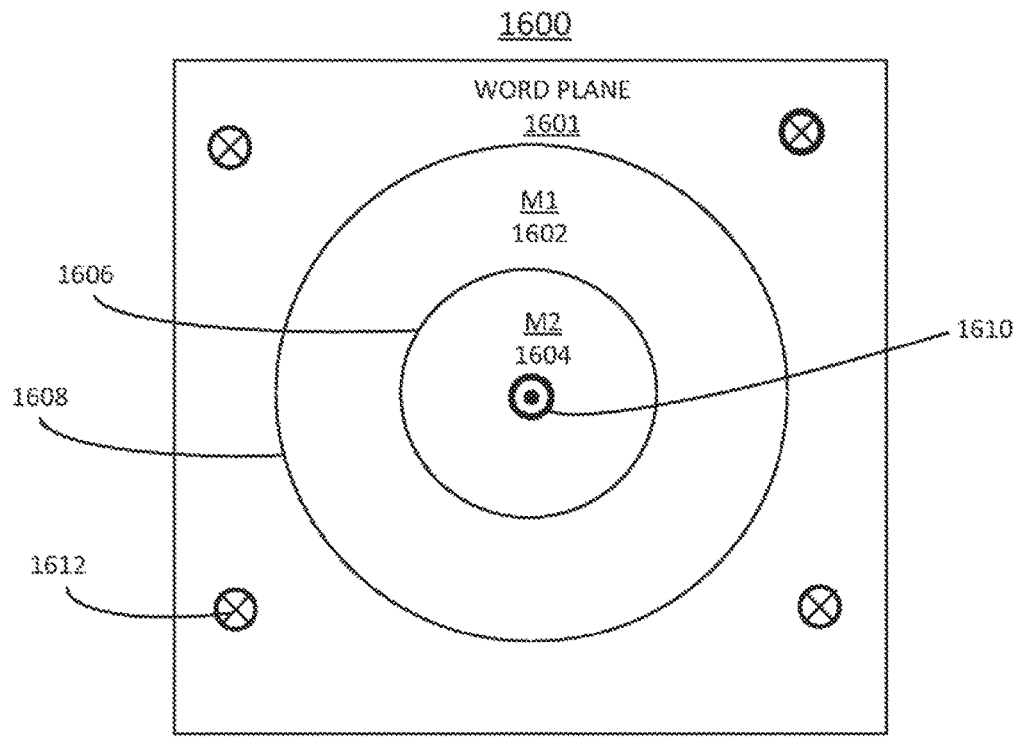
FIGS. 16A, and 16B illustrate example segregated media based silo magnetic media in accordance with preferred embodiments.
Figure 16B:
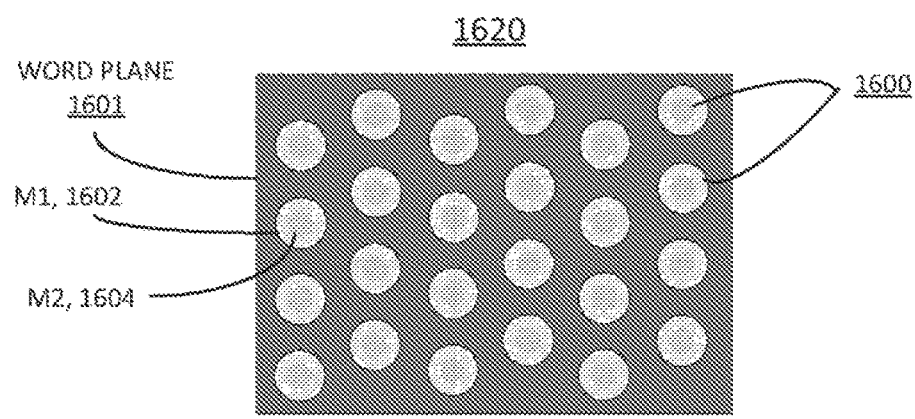

FIGS. 16A, and 16B illustrate example segregated media based silo magnetic media in accordance with preferred embodiments. In FIG. 16A, a top view of an example segregated media based pillar or silo magnetic memory cell generally designated by the reference character 1600 is shown surrounded by a word plane 1601. The silo magnetic memory cell 1600 includes a conductor M1, 1602 and a conductor M2, 1604 separated by a non-magnetic spacer layer 1606, such as Ruthenium layer. An electron tunnel barrier, thin oxide layer 1608 surrounds the conductor M1, 1602. Both conductors 1602, M1, 1604, M2 are electrically conductive and optionally the conductors 1602, M1, 1604, M2 are formed of magnetic materials, and the conductor 1604, M2 has a lower resistance and is more conductive than conductor 102, M1. A set magnetization 1610 is illustrated out of the plane for magnetic conductor 1604, M2. The word plane 1601 is formed of an electrically conductive and magnetic material. A reference layer 1612 is illustrated into the plane for the word plane 1601.

Referring to FIG. 16B, an example array generally designated by the reference character 1620 is shown of the segregated media based silo magnetic media cells 1600 with the word plane 1601 in accordance with preferred embodiments. Optionally, conductor 1604, M2 is formed of a non-magnetic material, for example, tantalum and conductor 1602, M1 is formed of a magnetic material. The non-magnetic conductor 1604, M2 is more electrically conductive than magnetic conductor 1602, M1.

Figure 17A:
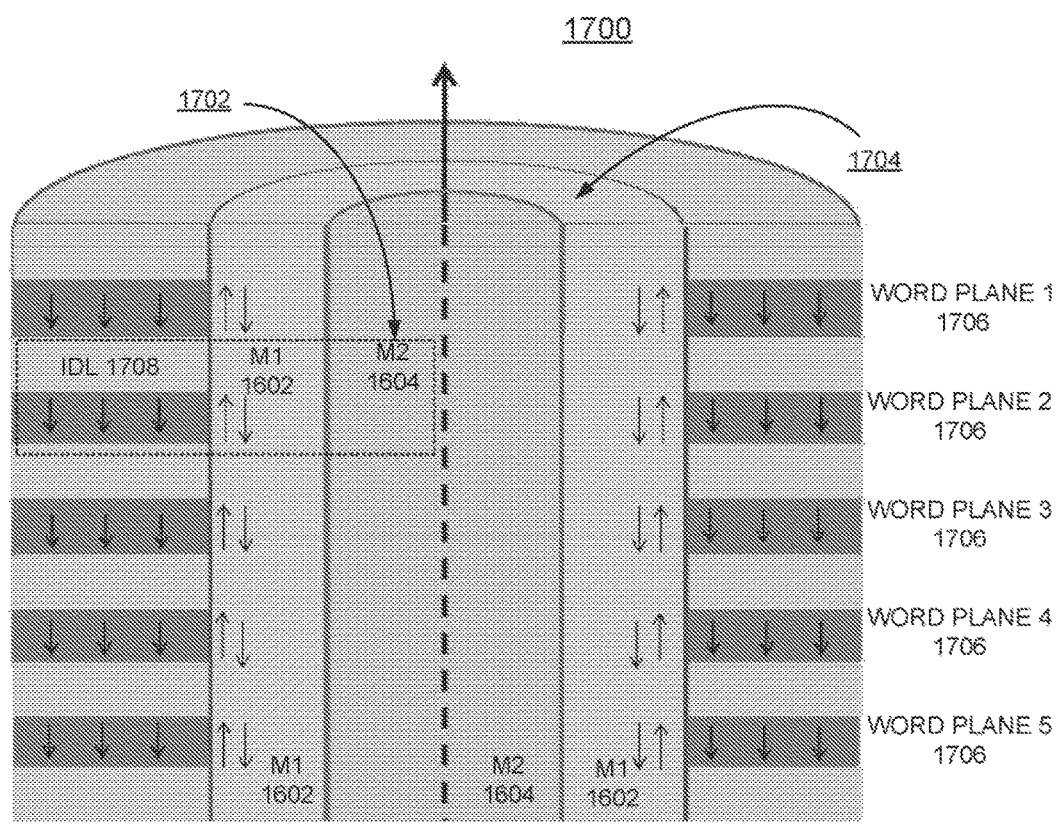
FIGS. 17A, and 17B illustrate an example detailed side view of a vertical pillar channel magnetic memory of memory cells in accordance with preferred embodiments.
Figure 17B:
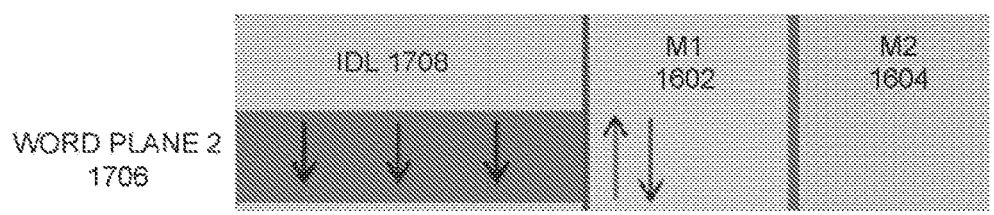

Referring to FIGS. 17A, and 17B, there is shown an example array generally designated by the reference character 1700 forming a vertical pillar channel magnetic memory of a plurality of memory cells 1702 in FIG. 17A and a detailed view of one cylindrical memory cell 1702 is shown in FIG. 17B in accordance with preferred embodiments.

In accordance with features of preferred embodiments, each memory cell 1702 includes a central conductor M2, 1604 and a conductor M1, 1602, such as shown in FIGS. 16A and 16B. Conductor M1, 1602 is coupled to respective word planes 1-5, 1706, as shown. The word planes 1-5, 1706 are reference layers and are separated by interlayer dielectric (IDL) 1708. The conductor M1, 1602 has a metallic granularity in the magnetic material to enable independently programming the cylindrical magnetic random access memory (MRAM) cells 1702. Each pillar 1704 including conductor M1, 1602 and conductor M2, 1604 of the vertical pillar channel magnetic memory array 1700 are unpatterned. There are no separate etching steps performed on the programmable cell area of conductor M1, 1602 within the pillars 1704 at each word plane 1-5, 1706. The programmable cell area of conductor M1, 1602 is capable of being programmed up or down inside each domain of M1 segregated media; the double arrow within conductor M1, 1602 can be set upward or set downward at each word plane level. The arrow within the conductor M2, 1604 indicates a direction of magnetization within the conductor M2 that is formed of a magnetic material.

FIGS. 18A, 18B, 18C, 18D and 18E and FIG. 19 illustrate segregated media used in programmed media M1 in accordance with preferred embodiments.

Referring to FIGS. 18A, 18B, 18C, 18D and 18E, there are shown example alternation magnetization variations respectively generally designated by reference characters 1800, 1810, 1820, 1830 and 1840 of biased elements of the vertical pillar channel magnetic memory in accordance with preferred embodiments.

Figure 18A:
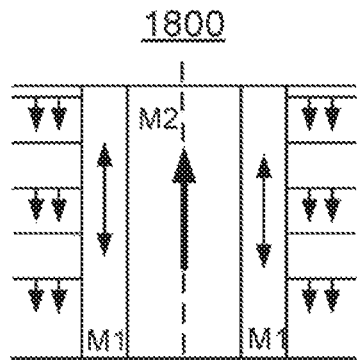
FIGS. 18A, 18B, 18C, 18D and 18E illustrate example alternation magnetization variations of biased elements of the vertical pillar channel magnetic memory of FIGS. 17A, and 17B in accordance with preferred embodiments.
Figure 18B:
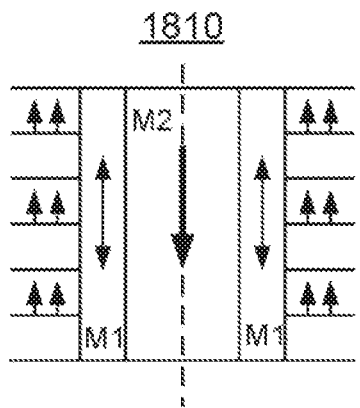
Figure 18C:
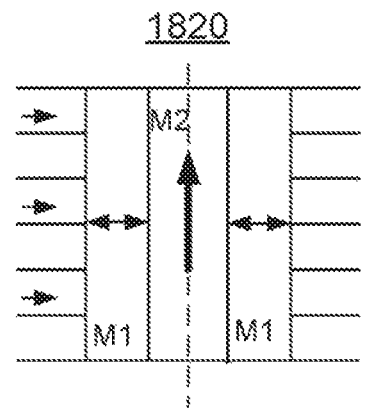
Figure 18D:
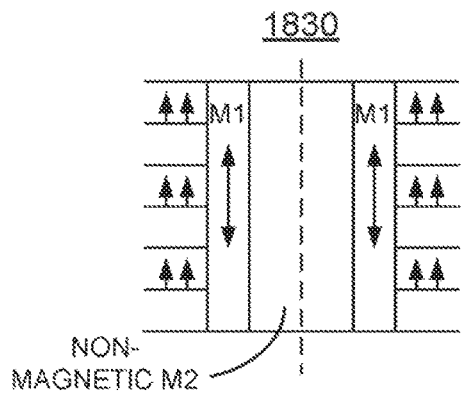
Figure 18E:
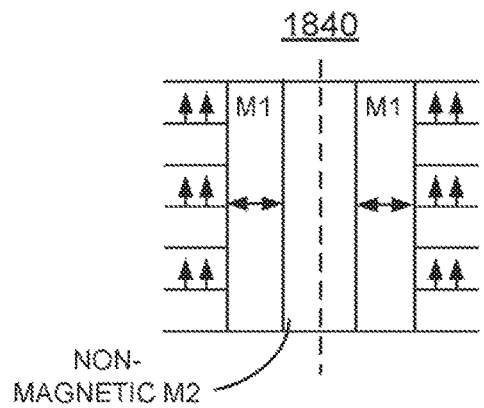

In FIGS. 18A, 18B, 18C, there are shown alternate magnetization embodiment variations 1800, 1810, and 1820 of biased elements within the programmed media or conductor M1, 1602 with conductor M2 formed of a magnetic material. In FIGS. 18D and 18E, there are shown alternate magnetization embodiment variations 1830, and 1840 of biased elements within the programmed media or conductor M1, 1602 with conductor M2 formed of a nonmagnetic material.

In accordance with features of preferred embodiments, various desirable magnetization states can be established with the segregated media used in the programmed media or conductor M1, 1602.

Figure 19:
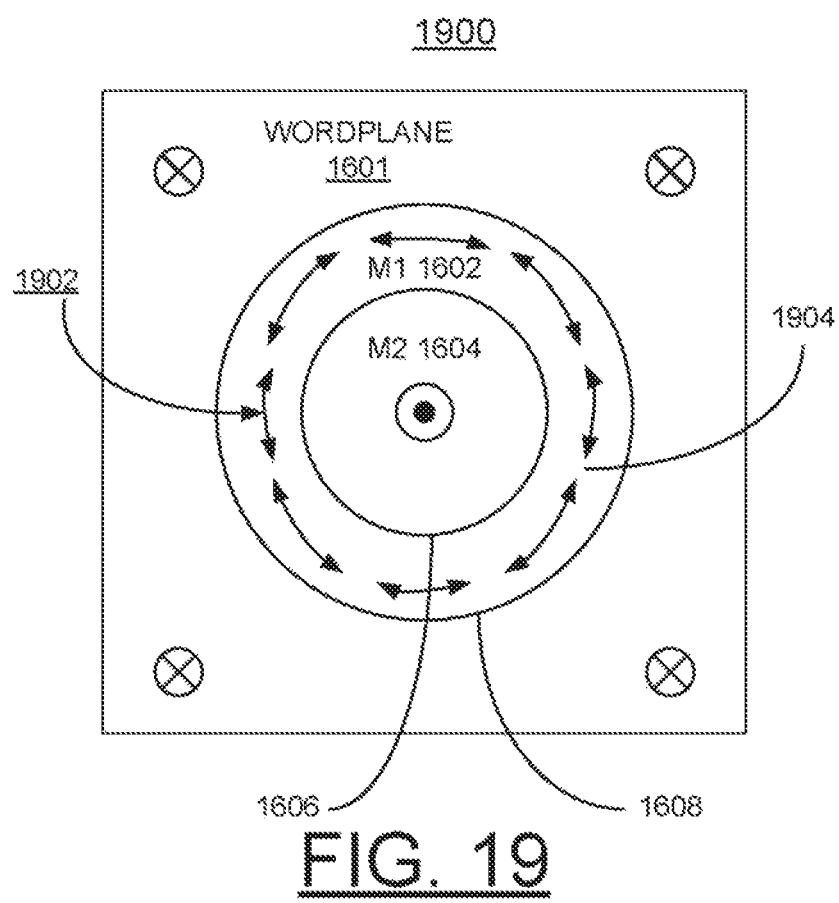
FIG. 19 illustrates an example detailed top view of a vertical pillar channel magnetic memory of memory cells in accordance with preferred embodiments.

In accordance with features of preferred embodiments, in FIG. 19, there is shown a top view of an example segregated media based pillar or silo magnetic memory cell generally designated by the reference character 1900 is shown surrounded by a word plane 1601. The silo magnetic memory cell 1900 includes a segregated media conductor M1, 1602 with a plurality of segregated media regions generally designated by the reference character 1902 spaced apart by respective regions 1904.

In accordance with features of preferred embodiments, challenges with continuous media in conductor M1, 1602 include, for example, circular magnetization in programmable media conductor M1, 1602 may force the programming to be only viable with Oersted field, and all bits in the vertical pillar are programmable at once. Easy programmability force bits to require significant magnetic volume with too tall pillars. Segregated media conductor M1, 1602 with a plurality of segregated media regions, such as illustrated in FIGS. 20A, and 20B, and FIGS. 21 and 22, mitigates challenges with continuous media in conductor M1, 1602.

Figure 21:
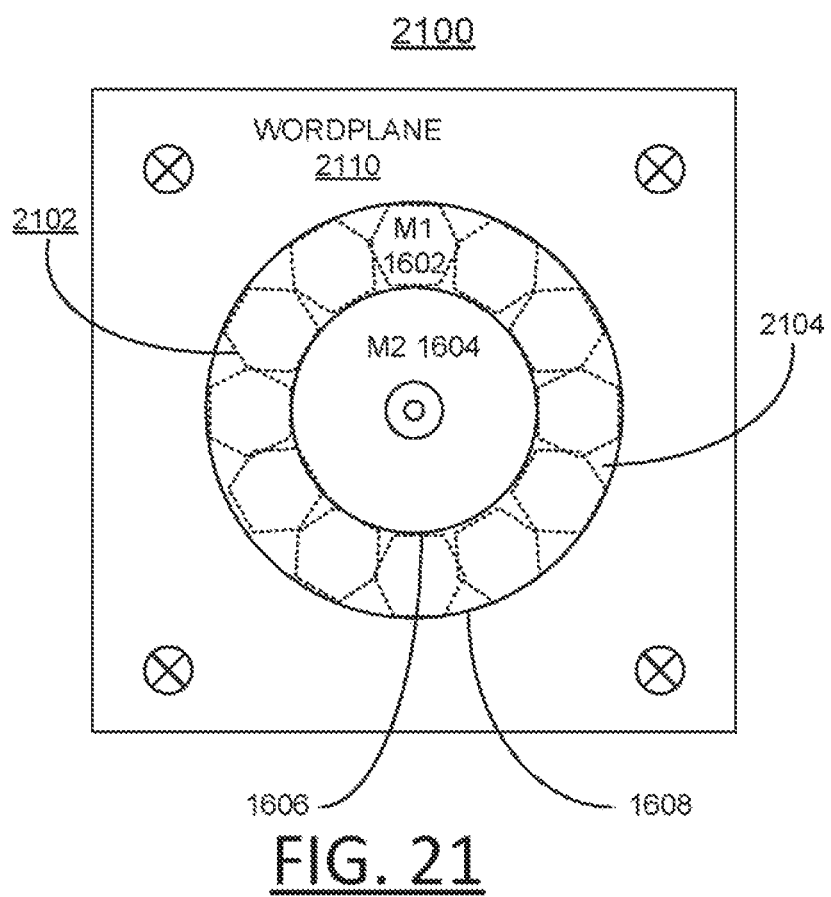
FIGS. 21 and 22 illustrate example detailed top views of a segregated media in layer M1 of vertical pillar channel magnetic memory of memory cells in accordance with preferred embodiments in accordance with preferred embodiments.
Figure 22:
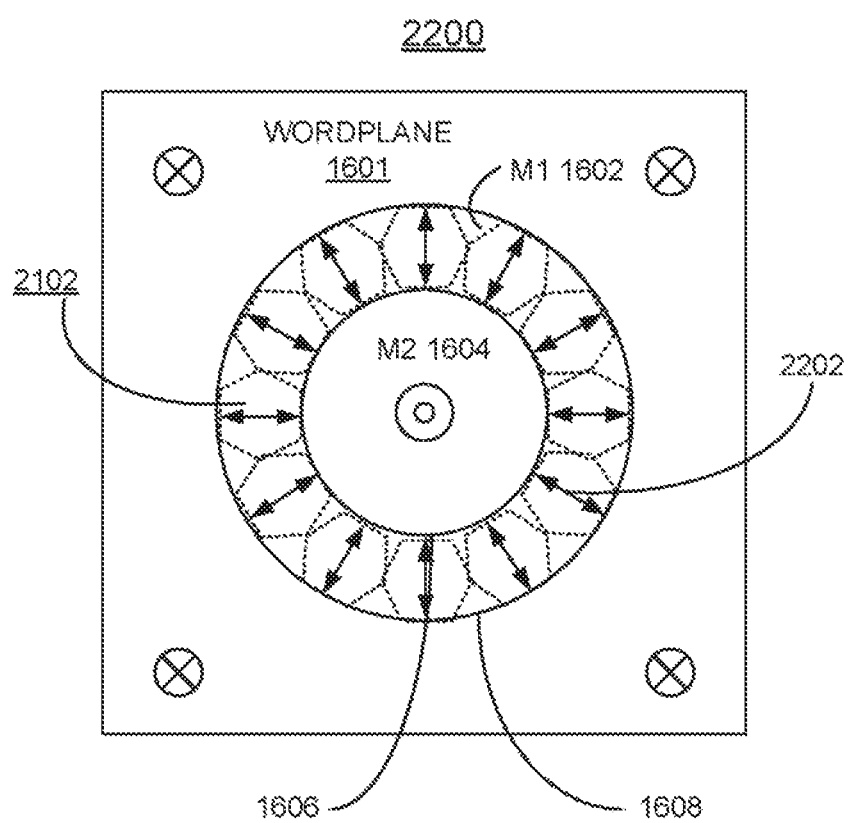

Referring now to FIGS. 21 and 22, there are shown a respective top view of an example segregated media based pillar or silo magnetic memory cell generally designated by the reference character 2100, 2200 in accordance with preferred embodiments. Each silo magnetic memory cell 2100, 2200 includes a segregated media conductor M1, 1602 with a plurality of segregated media regions generally designated by the reference character 2102 with spaced respective regions 2104.

Figure 20A:
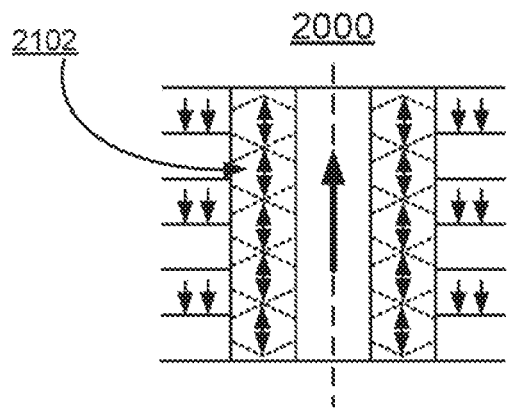
FIGS. 20A, and 20B illustrate example alternation magnetization variations of biased elements of the vertical pillar channel magnetic memory of FIGS. 21 and 22 in accordance with preferred embodiments; in accordance with preferred embodiments.
Figure 20B:
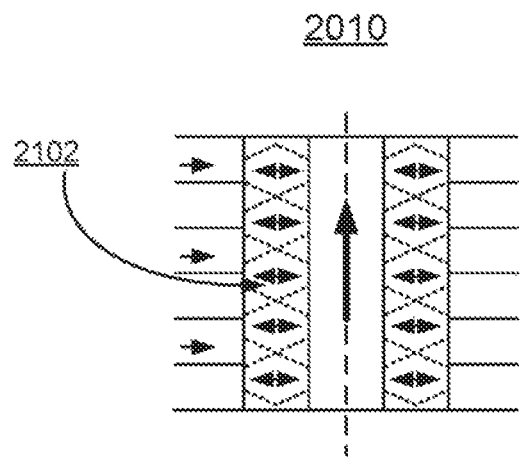

Referring also to FIGS. 20A, and 20B, there are shown example alternation magnetization embodiment variations respectively generally designated by reference characters 2000, 2010 of biased elements of segregated media conductor M1, 1602 with the plurality of segregated media regions or domains 2102 of FIGS. 21 and 22 in accordance with preferred embodiments. In FIG. 20A, the example alternation magnetization embodiment variation 2000 illustrates possible programming up or down inside of each domain 2102. In FIG. 20B, the example alternation magnetization embodiment variation 2010 illustrates possible programming side to side inside of each domain 2102.

While the present invention has been described with reference to the details of the embodiments of the invention shown in the drawing, these details are not intended to limit the scope of the invention as claimed in the appended claims.

What is claimed is:

1. A method for implementing a magnetic memory array comprising:
   forming a plurality of magnetic pillar memory cells that include a first magnetic conductor M1 and a second conductor M2 and wherein said first magnetic conductor M1 and said second conductor M2 are formed of a magnetic material, and said second conductor M2 being more electrically conductive than said first magnetic conductor M1 including:
      growing said second conductor M2, wherein growing said second conductor M2 includes forming said second conductor M2 of a magnetic material;
      coating said second conductor M2 with a non-magnetic spacer layer;
      growing said first magnetic conductor M1 over said coated second conductor M2, wherein the first magnetic conductor M1 has a metallic granularity;
      depositing an oxide barrier over said grown first magnetic conductor M1 forming magnetic pillar memory cells, wherein each magnetic pillar memory cell is configured to be independently programmed; and
      depositing an interlayer dielectric (IDL) stack of word planes separated by a respective IDL.

2. The method as recited in claim 1 wherein forming said magnetic pillar memory cells includes providing a complementary metal oxide semiconductor (CMOS) wafer having a CMOS defined pad pattern, and growing said magnetic pillar memory cells on said CMOS defined pad pattern.

3. The method as recited in claim 2 includes treating said CMOS defined pad pattern for providing a source of growth for said plurality of magnetic pillar memory cells.

4. The method as recited in claim 1 including forming vias in said IDL stack, and forming other conductive electrical connections.

5. The method as recited in claim 1 wherein growing said second conductor M2 and growing said first conductor M1 includes each said first conductor M1 and said second conductor M2 not being patterned.

6. A method for implementing a magnetic memory array comprising:
   forming a plurality of magnetic pillar memory cells that include a first magnetic conductor M1 and a second magnetic conductor M2 being formed of a magnetic material, and said second magnetic conductor M2 being more electrically conductive than said first magnetic conductor M1 including:
      growing said second conductor M2, wherein growing said second conductor M2 includes forming said second conductor M2 of a non-magnetic material;
      coating said second conductor M2 with a non-magnetic spacer layer;
      growing said first magnetic conductor M1 over said coated second conductor M2;
      depositing an oxide barrier over said grown first magnetic conductor M1 forming magnetic pillar memory cells, wherein the first magnetic conductor M1 of said magnetic material has a metallic granularity enabling independent programming of each magnetic pillar memory cell; and depositing an interlayer dielectric (IDL) stack of word planes separated by a respective IDL.

7. The method as recited in claim 6 wherein forming said magnetic pillar memory cells includes providing a complementary metal oxide semiconductor (CMOS) wafer having a CMOS defined pad pattern, and growing said magnetic pillar memory cells on said CMOS defined pad pattern.

8. The method as recited in claim 7 includes treating said CMOS defined pad pattern for providing a source of growth for said plurality of magnetic pillar memory cells.

9. The method as recited in claim 6 including forming vias in said IDL stack, and forming other conductive electrical connections.

10. The method as recited in claim 6 wherein growing said second conductor M2 and growing said first conductor M1 includes each said first conductor M1 and said second conductor M2 not being patterned.

11. A method for implementing a magnetic memory array comprising:

forming a plurality of magnetic pillar memory cells that include a first magnetic conductor M1 being formed of a magnetic material, and a second conductor M2 being more electrically conductive than said first magnetic conductor M1 including:

growing said second conductor M2;

coating said second conductor M2 with a non-magnetic spacer layer;

growing said first magnetic conductor M1 over said coated second conductor M2;

depositing an oxide barrier over said grown first magnetic conductor M1 forming magnetic pillar memory cells, wherein the first conductor M1 of said magnetic material has a metallic granularity enabling independent programming of each magnetic pillar memory cell;

depositing an interlayer dielectric (IDL) stack of word planes separated by a respective IDL; and sharing a bit line only by said magnetic pillar memory cells inside pillar holes.

12. The method as recited in claim 11 wherein forming said magnetic pillar memory cells includes providing a complementary metal oxide semiconductor (CMOS) wafer having a CMOS defined pad pattern, and growing said magnetic pillar memory cells on said CMOS defined pad pattern.

13. The method as recited in claim 12 includes treating said CMOS defined pad pattern for providing a source of growth for said plurality of magnetic pillar memory cells.

14. The method as recited in claim 11 including forming vias in said IDL stack, and forming other conductive electrical connections.

15. The method as recited in claim 11 wherein growing said second conductor M2 and growing said first conductor M1 includes each said first conductor M1 and said second conductor M2 not being patterned.

* * * * *